(12) United States Patent
Hase et al.

(10) Patent No.: US 10,596,796 B2
(45) Date of Patent: Mar. 24, 2020

(54) DECORATING LAMINATED FILM FOR THREE-DIMENSIONAL MOLDED ARTICLE, PRODUCTION METHOD THEREOF, AND THREE-DIMENSIONAL DECORATING METHOD

(71) Applicant: NIPPON PAINT AUTOMOTIVE COATINGS CO., LTD., Osaka (JP)

(72) Inventors: Takakazu Hase, Osaka (JP); Masahiro Kitamura, Osaka (JP)

(73) Assignee: NIPPON PAINT AUTOMOTIVE COATINGS CO., LTD., Osaka (JP)

( * ) Notice: Subject to any disclaimer, the term of this patent is extended or adjusted under 35 U.S.C. 154(b) by 279 days.

(21) Appl. No.: 15/527,797

(22) PCT Filed: Nov. 18, 2015

(86) PCT No.: PCT/JP2015/082351
§ 371 (c)(1),
(2) Date: May 18, 2017

(87) PCT Pub. No.: WO2016/080423
PCT Pub. Date: May 26, 2016

(65) Prior Publication Data
US 2018/0345643 A1 Dec. 6, 2018

(30) Foreign Application Priority Data
Nov. 19, 2014 (JP) .................................. 2014-234297

(51) Int. Cl.
*B32B 37/14* (2006.01)
*B29C 51/12* (2006.01)
(Continued)

(52) U.S. Cl.
CPC ............ *B32B 37/144* (2013.01); *B29C 51/12* (2013.01); *B32B 27/00* (2013.01); *B32B 33/00* (2013.01);
(Continued)

(58) Field of Classification Search
CPC ..... B29C 33/301; B29C 70/342; B29C 51/12; B29K 2105/0872; B29L 2031/082;
(Continued)

(56) References Cited

FOREIGN PATENT DOCUMENTS

JP          5-278399 A       10/1993
JP          10-735 A          1/1998
(Continued)

OTHER PUBLICATIONS

Machine translation of JP 05-278399; Publication date: Oct. 26, 1993.*
(Continued)

*Primary Examiner* — Vishal I Patel
(74) *Attorney, Agent, or Firm* — Ladas & Parry LLP; Malcolm J. MacDonald

(57) ABSTRACT

The present disclosure is aimed at providing a laminated film for decorating a three-dimensional molded product with which problems on a split, white turbidity and the like in the laminated film for decorating a three-dimensional molded product having a metallic tone design layer can be improved and an outer film having excellent characteristics with regard to scratch resistance, hardness, chemical resistance, and the like on the surface of the film after decorating can be formed.
A laminated film for decorating a three-dimensional molded product, having
  an adhesion layer (A),
  a metallic tone design layer (B) constituted of a coating film layer (B-1) containing vapor-deposited aluminum or a vapor-deposited metal layer (B-2) composed of indium or tin,
(Continued)

a clear coating film layer (C) composed of an energy ray-curable coating film, and
a base material film layer (D).

7 Claims, 4 Drawing Sheets

(51) Int. Cl.
| | |
|---|---|
| *B32B 27/00* | (2006.01) |
| *C23C 14/00* | (2006.01) |
| *C23C 14/20* | (2006.01) |
| *C23C 14/14* | (2006.01) |
| *B32B 33/00* | (2006.01) |
| *B32B 37/02* | (2006.01) |
| *B32B 38/00* | (2006.01) |
| *B32B 37/24* | (2006.01) |
| *B32B 7/12* | (2006.01) |
| *B32B 15/095* | (2006.01) |
| *B32B 37/26* | (2006.01) |

(52) U.S. Cl.
CPC .......... *B32B 37/02* (2013.01); *B32B 38/0008* (2013.01); *B32B 38/145* (2013.01); *C23C 14/0015* (2013.01); *C23C 14/14* (2013.01); *C23C 14/20* (2013.01); *B32B 7/12* (2013.01); *B32B 15/095* (2013.01); *B32B 2037/243* (2013.01); *B32B 2037/268* (2013.01); *B32B 2038/0076* (2013.01); *B32B 2255/06* (2013.01); *B32B 2255/26* (2013.01); *B32B 2307/714* (2013.01); *B32B 2375/00* (2013.01)

(58) Field of Classification Search
CPC ....... B32B 27/00; B32B 33/00; B32B 15/095; B32B 7/12; B32B 38/0008; B32B 2037/243; B32B 2307/714; B32B 2255/26; B32B 2255/06; B32B 2038/0076; B32B 2037/268; B32B 38/145; B32B 2375/00; B32B 37/144; B32B 37/02; C23C 14/20; C23C 14/14; C23C 14/0015

See application file for complete search history.

(56) References Cited

FOREIGN PATENT DOCUMENTS

| | | |
|---|---|---|
| JP | 2003-200502 A | 7/2003 |
| JP | 2008-55688 A | 3/2008 |
| JP | 2011-140127 A | 7/2011 |
| JP | 2014-83817 A | 5/2014 |

OTHER PUBLICATIONS

Non-English International Search Report dated Jan. 19, 2016 for Application No. PCT/JP2015/082351 with an English translation.
Espacenet English abstract of JP 5-278399 A.
Espacenet English abstract of JP 2014-83817 A.
Espacenet English abstract of JP 2011-140127 A.
Espacenet English abstract of JP 2003-200502 A.
Espacenet English abstract of JP 10-735 A.
Espacenet English abstract of JP 2008-55688 A.
English translation of JP 5-278399 A.
English translation of JP 2014-83817 A.
English translation of JP 2011-140127 A.
English translation of JP 2003-200502 A.
English translation of JP 10-735 A.
English translation of JP 2008-55688 A.

* cited by examiner

DECORATING LAMINATED FILM FOR THREE-DIMENSIONAL MOLDED ARTICLE, PRODUCTION METHOD THEREOF, AND THREE-DIMENSIONAL DECORATING METHOD

TECHNICAL FIELD

The present disclosure relates to a laminated film for decorating a three-dimensional molded product, a production method thereof and a three-dimensionally decorating method.

BACKGROUND OF THE DISCLOSURE

A laminated film for decorating a three-dimensional molded product has been used for subjecting molded products obtained from various materials including plastics, metals and the like to metallic tone decorating (Patent Documents 1 and 2). In such a method, it has been known that a laminated film for decorating having a metallic tone design layer composed of a vapor-deposited metal layer, a coating film containing a vapor-deposited aluminum pigment, and the like is used for subjecting a formed product to decorating.

In decorative forming by such a laminated film for three-dimensional decorating having a metallic tone design layer, it is necessary for the film to be stretched along the three-dimensional shape. However, in stretching of such a film, the metallic tone design layer does not sufficiently follow the resin layer, and a split or white turbidity has been frequently generated in the metallic tone design layer.

Moreover, in Patent Documents 1 and 2, a decorative film is produced based on a thermoplastic sheet. However, depending on the application of a molded product, there is a case where the surface of the film after decorating is required to have scratch resistance, sufficient hardness, chemical resistance, and the like. In order to attain these characteristics, it has been desired to form a highly-crosslinked coating film including an energy ray-curable resin layer because the thermoplastic film is unequal to the task. However, in the technical field of the laminated film for three-dimensional decorating, such an investigation has not been sufficiently conducted.

PRIOR TECHNICAL DOCUMENT

Patent Document

[Patent Document 1] Japanese Kokai Publication Hei10-735
[Patent Document 2] Japanese Kokai Publication 2008-55688

SUMMARY OF INVENTION

Problem to be Solved by the Invention

The present disclosure has been made in view of the above-mentioned circumstances, and is aimed at providing a laminated film for decorating a three-dimensional molded product with which problems on a split, white turbidity and the like in the laminated film for decorating a three-dimensional molded product having a metallic tone design layer can be improved and an outer film having excellent characteristics with regard to scratch resistance, hardness, chemical resistance, and the like on the surface of the film after decorating can be formed. Furthermore, the present disclosure is also aimed at providing a production method thereof and a three-dimensionally decorating method.

Means for Solving Object

The present disclosure is directed to a laminated film for decorating a three-dimensional molded product, having
an adhesion layer (A),
a metallic tone design layer (B) constituted of a coating film layer (B-1) containing vapor-deposited aluminum or a vapor-deposited metal layer (B-2) composed of indium or tin,
a clear coating film layer (C) composed of an energy ray-curable coating film, and
a base material film layer (D).

It is preferred that the clear coating film layer (C) composed of an energy ray-curable coating film be formed from an active energy ray-curing type coating composition containing a polyurethane acrylate (C1), a monomer/oligomer (C2) having an unsaturated double bond and a polymerization initiator (C3).

It is preferred that the metallic tone design layer (B) have a thickness of less than or equal to 5 μm.

The laminated film for decorating a three-dimensional molded product may be a laminated film further having a design layer (G) formed by printing.

The laminated film for decorating a three-dimensional molded product may be a laminated film further having a protective layer (F) adjacent to the metallic tone design layer (B).

The present disclosure is also directed to a production method of a laminated film for decorating a three-dimensional molded product described above including
a step (1-1) of forming a clear coating film layer (C) composed of an energy ray-curable coating film on a base material film layer (D),
a step (1-2) of forming a metallic tone design layer (B) constituted of a coating film layer (B-1) containing vapor-deposited aluminum or a vapor-deposited metal layer (B-2) composed of indium or tin on the film subjected to the step (1-1), and
a step (1-3) of forming an adhesion layer (A) on the film obtained by the step (1-2).

The production method of a laminated film for decorating a three-dimensional molded product may be a production method further including a step (1-4) of forming a protective layer (F) to be adjacent to a metallic tone design layer (B) on the clear coating film layer (C) after performing the step (1-1) and before performing the step (1-2).

The production method of a laminated film for decorating a three-dimensional molded product may be a production method further including a step (1-4) of forming a design layer (G) by printing after performing the step (1-1) and before performing the step (1-2).

The present disclosure is also directed to a production method of a laminated film for decorating a three-dimensional molded product described above including
a step (2-1) of forming a clear coating film layer (C) composed of an energy ray-curable coating film on a base material film layer (D),
a step (2-2) of forming an adhesion layer (A) and a metallic tone design layer (B) constituted of a coating film layer (B-1) containing vapor-deposited aluminum or a vapor-deposited metal layer (B-2) composed of indium or tin on a base material film layer (X) separately, and
a step (2-3) of bonding the film obtained in the step (2-1) and the film obtained in the step (2-2) together.

The production method of a laminated film for decorating a three-dimensional molded product may be a production method further including a step (2-4) of forming a protective layer (F) to be adjacent to the metallic tone design layer (B) on the clear coating film layer (C) after performing the step (2-1) and before performing the step (2-3).

The production method of a laminated film for decorating a three-dimensional molded product may be a production method further including a step (2-5) of forming a design layer (G) by printing after performing the step (2-1) or step (2-4) and before performing the step (2-3).

The present disclosure is also directed to a decorating method of a three-dimensional molded product including the step of making an adhesion layer of a laminated film for decorating a three-dimensional molded product described above bond to a surface of the three-dimensional molded product under a heating condition.

Effect of the Invention

In the laminated film for decorating a three-dimensional molded product according to the present disclosure, a split, white turbidity and the like are not generated in a metal design layer, satisfactory design can be formed, and the laminated film has excellent characteristics with regard to scratch resistance, hardness, chemical resistance, and the like on the surface of the film after decorating.

DETAILED DESCRIPTION OF PREFERRED EMBODIMENTS

Figure 1:
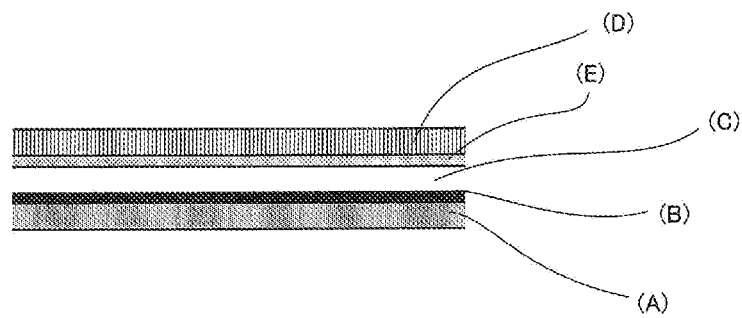
FIG. 1 is a schematic view showing an example of the laminated structure of the laminated film for decorating a three-dimensional molded product according to the present disclosure.

Hereinafter, the present disclosure will be described in detail.

(Laminated Film for Decorating Three-Dimensional Molded Product)

The laminated film for decorating a three-dimensional molded product according to the present disclosure is a film used for decorative forming of a three-dimensional molded product. That is, by making a film having a design property bond to each of various molded bodies, the molded body is imparted with the design property and is imparted with a surface protecting function. On this occasion, the laminated film is deformed into a shape along the surface with a three-dimensional shape to be brought into close contact therewith.

As a method of bringing the laminated film into close contact therewith as described above, any known method can be used, and examples thereof can include a method of deforming a laminated film by a vacuum forming method, a pressure forming method or the like and bringing the laminated film into close contact therewith. Moreover, a method of deforming a laminated film for decorative forming placed in the inside of a mold into a shape of the outer wall surface of the mold and then performing injection molding, and the like can be exemplified.

The laminated film for decorating a three-dimensional molded product according to the present disclosure is a laminated film having (A) an adhesion layer, (B) a metallic tone design layer (B) constituted of a coating film layer (B-1) containing vapor-deposited aluminum or a vapor-deposited metal layer (B-2) composed of indium or tin, (C) a clear coating film layer composed of an energy ray-curable coating film, and (D) a base material film layer.

That is, by being made to have a (B) layer having a metallic tone appearance and being made to have a coating film layer composed of an energy ray-curable coating film, decorating which makes the three-dimensional molded product have a satisfactory metallic appearance by virtue of the combination thereof, does not generate problems on a split, white turbidity and the like in the case of being applied to a three-dimensionally shaped article, and is also excellent in respective kinds of performance such as the hard coating property, flexibility, chemical resistance and weather resistance can be performed.

Among the respective layers, the adhesion layer (A) is required to be the outermost layer, and the metallic tone design layer (B) exists between the clear coating film layer (C) composed of an energy ray-curable coating film and the adhesion layer (A). On this account, since it follows that the clear coating film layer (C) is formed on the outside of the metallic tone design layer (B) having a metallic tone after decorative forming is performed, excellent effects can be attained in the points of the hard coating property, chemical resistance, weather resistance and the like.

Furthermore, a laminated film in which a release layer (E), a protective layer (F) and a design layer (G) formed by printing may be formed as necessary in addition to the respective layers may be adopted. The protective layer (F) is preferred in the point that the turbulence in appearance of the metallic tone design layer (B) is hardly generated when the protective layer (F) is provided. Moreover, in the case of providing the design layer (G) formed by printing, the case is preferred in the point that a design property by printing and a design property by the metallic tone design layer can be combined to attain specific design appearance.

Moreover, in the case where the design layer (G) formed by printing is formed by printing using an energy ray-curing type ink, it is preferred that an ultraviolet ray-absorbing layer (H) be provided. That is, it is necessary for the energy ray-curing type ink to be cured at the time of film preparation, and when this ink is cured, it is preferred that the clear coating film layer (C) be prevented from being cured simultaneously therewith. Since the ultraviolet ray-absorbing layer (H) is provided for the above-described purpose, it is preferred that the layer be provided between the design layer (G) formed by printing and the clear coating film layer (C).

As the layer constitution of a laminated film for decorating a three-dimensional molded product by which the above-described effects are attained, layer constitutions shown in FIGS. 1 to 10 can be exemplified.

The laminated film for decorating a three-dimensional molded product shown in FIG. 1 is a film prepared by laminating an adhesion layer (A), a metallic tone design layer (B), a clear coating film layer (C) composed of an energy ray-curable coating film, a release layer (E) and a base material film layer (D) in this order.

The film with such a constitution is made to bond to a three-dimensional molded product by means of the adhesion layer (A), and after decorative forming, the base material film layer (D) is peeled off to perform decorating. On this account, a decorating layer composed of three layers of the adhesion layer (A), the metallic tone design layer (B) and the clear coating film layer (C) composed of an energy ray-curable coating film is formed on the surface of the three-dimensional molded product.

Figure 2:
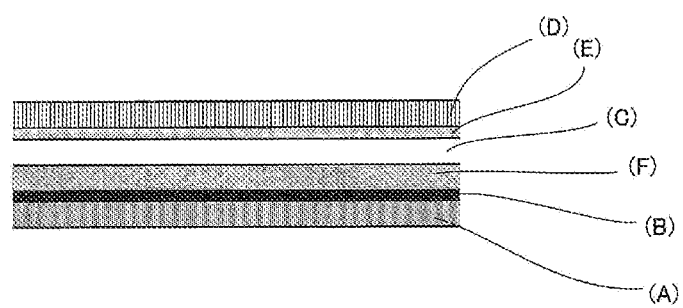
FIG. 2 is a schematic view showing an example of the laminated structure of the laminated film for decorating a three-dimensional molded product according to the present disclosure.

The laminated film for decorating a three-dimensional molded product shown in FIG. 2 is a film prepared by laminating an adhesion layer (A), a metallic tone design layer (B), a protective layer (F), a clear coating film layer (C) composed of an energy ray-curable coating film, a release layer (E) and a base material film layer (D) in this order.

The film with such a constitution is made to bond to a three-dimensional molded product by means of the adhesion layer (A), and after decorative forming, the base material film layer (D) is peeled off to perform decorating. On this account, a decorating layer composed of four layers of the adhesion layer (A), the metallic tone design layer (B), the protective layer (F) and the clear coating film layer (C) composed of an energy ray-curable coating film is formed on the surface of the three-dimensional molded product.

Figure 3:
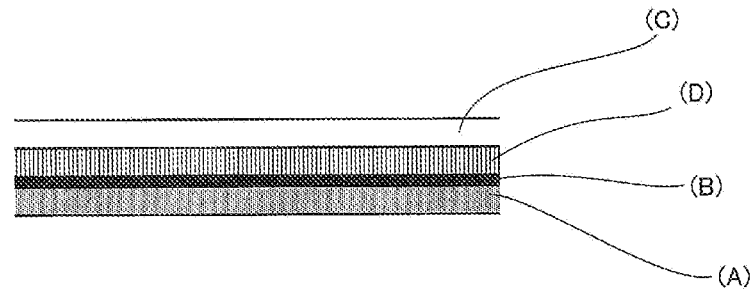
FIG. 3 is a schematic view showing an example of the laminated structure of the laminated film for decorating a three-dimensional molded product according to the present disclosure.

The laminated film for decorating a three-dimensional molded product shown in FIG. 3 is a film prepared by laminating an adhesion layer (A), a metallic tone design layer (B), a base material film layer (D) and a clear coating film layer (C) in this order. In such a film, the base material film layer (D) is not peeled off, and a decorating layer further including the base material film layer is formed on the surface of the three-dimensional molded product.

Figure 4:
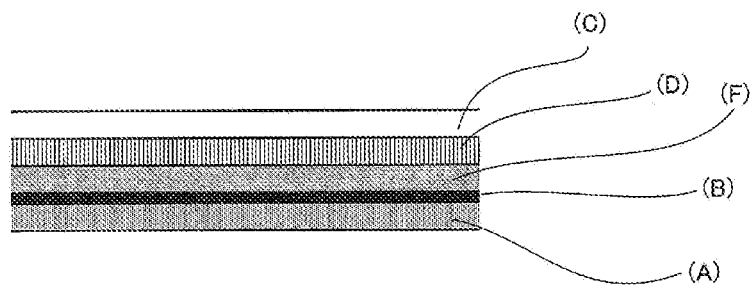
FIG. 4 is a schematic view showing an example of the laminated structure of the laminated film for decorating a three-dimensional molded product according to the present disclosure.
Figure 5:
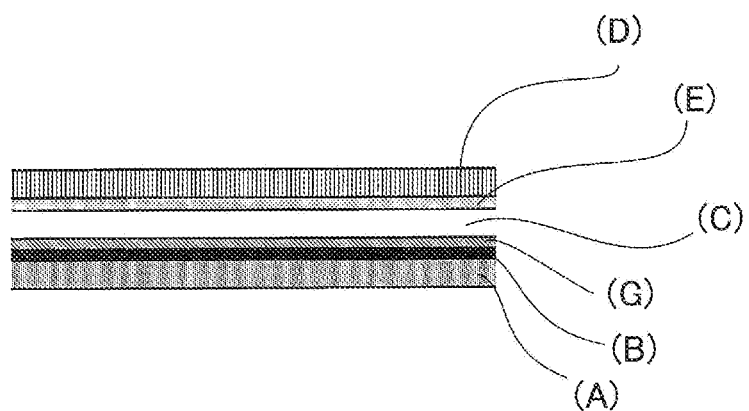
FIG. 5 is a schematic view showing an example of the laminated structure of the laminated film for decorating a three-dimensional molded product according to the present disclosure.
Figure 6:
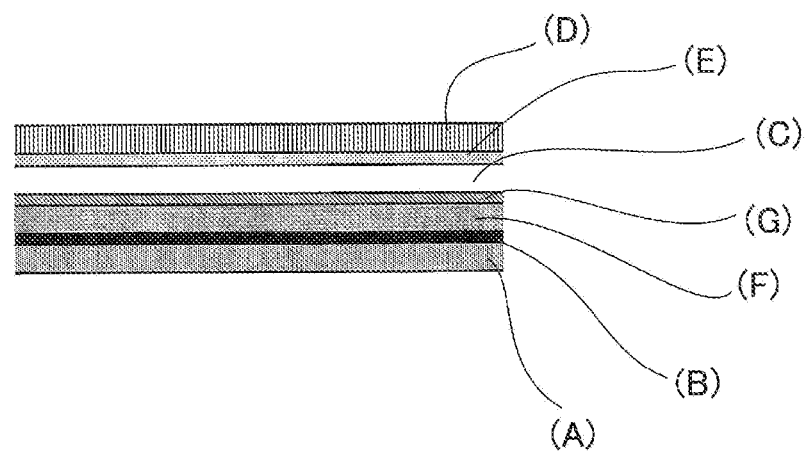
FIG. 6 is a schematic view showing an example of the laminated structure of the laminated film for decorating a three-dimensional molded product according to the present disclosure.
Figure 7:
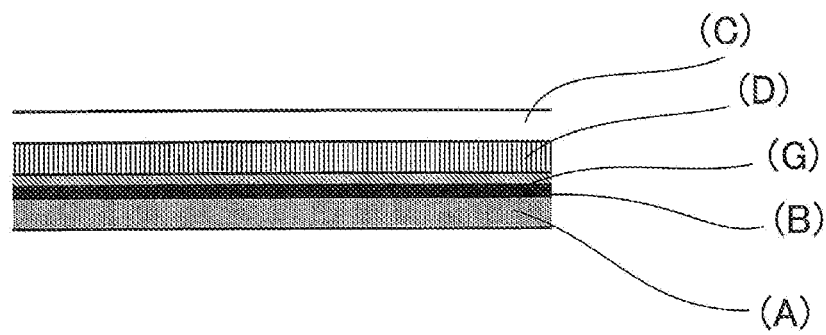
FIG. 7 is a schematic view showing an example of the laminated structure of the laminated film for decorating a three-dimensional molded product according to the present disclosure.
Figure 8:
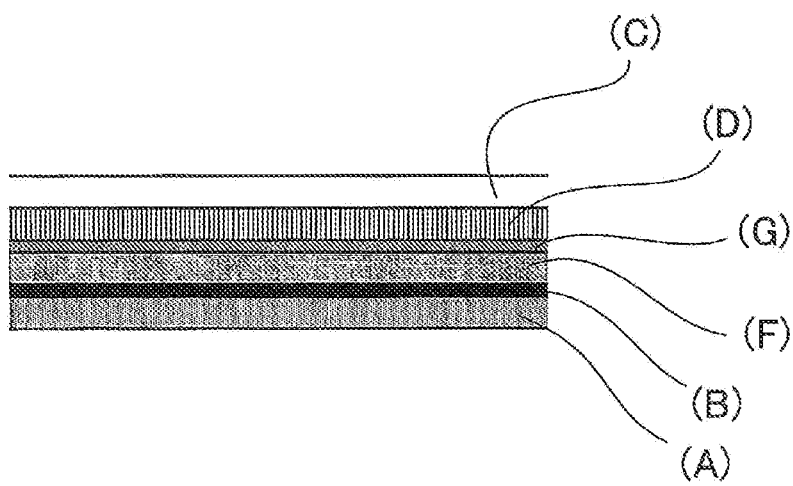
FIG. 8 is a schematic view showing an example of the laminated structure of the laminated film for decorating a three-dimensional molded product according to the present disclosure.

The laminated film for decorating a three-dimensional molded product shown in FIG. 4 is a film prepared by laminating an adhesion layer (A), a metallic tone design layer (B), a protective layer (F), a base material film layer (D) and a clear coating film layer (C) in this order. Even in such a film, the base material film layer (D) is not peeled off, and a decorating layer further including the base material film layer is formed on the surface of the three-dimensional molded product.

The laminated films for decorating a three-dimensional molded product shown in FIGS. 5 to 8 are laminated films for decorating a three-dimensional molded product having a design layer (G) formed by printing. These laminated films each have a constitution in which each of the embodiments shown in FIGS. 1 to 4 described above is added with a design layer (G) formed by printing.

Figure 9:
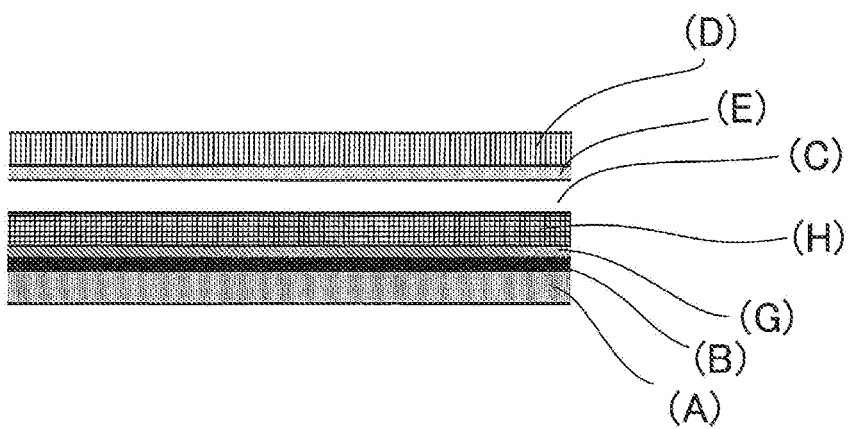
FIG. 9 is a schematic view showing an example of the laminated structure of the laminated film for decorating a three-dimensional molded product according to the present disclosure.
Figure 10:
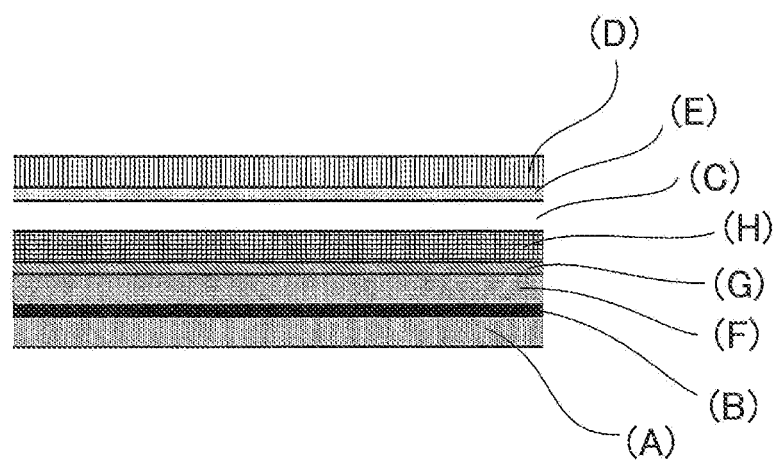
FIG. 10 is a schematic view showing an example of the laminated structure of the laminated film for decorating a three-dimensional molded product according to the present disclosure.

The laminated films for decorating a three-dimensional molded product shown in FIGS. 9 and 10 have a constitution to which an ultraviolet ray-absorbing layer (H) is further provided in addition to a design layer (G) formed by printing. By performing energy ray irradiation for curing the design layer (G) from the lower side of the film in the figure and performing energy ray irradiation for curing the clear coating film layer (C) from the upper side of the film in the figure, the clear coating film layer (C) can be cured after forming without curing the clear coating film layer (C) at the time of film production.

Hereinafter, these respective layers constituting the laminated film for decorating a three-dimensional molded product will be sequentially described.

(Adhesion Layer (A))

At the time of decorating a base material with a laminated film, the adhesion layer (A) is used for bringing the laminated film into close contact with the base material surface to be made to bond thereto.

An adhesive agent contained in the adhesion layer (A) is not particularly limited as long as the adhesive agent is a conventionally known adhesive agent, and examples thereof can include VYLON UR-3200 (available from TOYOBO CO., LTD.), UR-1361ET (available from TOAGOSEI CO., LTD.) and the like.

The adhesive agent may be one formed by allowing an adhesive agent to be applied/dried and may be one formed by laminating an adhesive sheet.

The thickness of the adhesion layer (A) is not particularly limited, and for example, it is preferred that the thickness be 3 to 30 μm and it is further preferred that the thickness be 5 to 25 μm. When being less than 3 μm, there is a possibility that the adhesion cannot be sufficiently secured, and when being greater than 30 μm, it becomes difficult to be applied and dried, and moreover, the film becomes disadvantageous from an aspect of cost.

(Metallic Tone Design Layer (B))

In the present disclosure, a coating film layer (B-1) containing vapor-deposited aluminum or a vapor-deposited metal layer (B-2) composed of indium or tin is formed in order to make a three-dimensional molded product have an excellent metallic tone appearance as if the three-dimensional molded product were made of metal. Since a metallic tone design layer constituted of (B-1) or (B-2) mentioned above is formed, not only a satisfactory metallic appearance can be attained but also decorating which does not generate a split or white turbidity attributed to stretching at the time of subjecting a three-dimensional molded product to decorating and makes the three-dimensional molded product have a satisfactory metallic tone can be performed.

Such a metallic tone design layer is constituted of a coating film layer (B-1) containing vapor-deposited aluminum or a vapor-deposited metal layer (B-2) composed of indium or tin, and hereinafter, these layers will be described in detail.

(Coating Film Layer (B-1) Containing Vapor-Deposited Aluminum)

First of all, as the coating film layer constituting the metallic tone design layer in the present disclosure, one formed of a coating containing a vapor-deposited aluminum pigment is exemplified.

Examples of such a coating film layer (B-1) containing a vapor-deposited aluminum pigment can include one formed of a metallic base coating containing 30 to 85% by weight of a vapor-deposited aluminum pigment relative to the amount of solid matter in the coating.

The vapor-deposited aluminum pigment is one prepared by shredding a vapor-deposited aluminum film into flaky pieces. For example, a plastic film such as oriented polypropylene, crystalline polypropylene or polyethylene terephthalate is used as a base film, a release agent is applied thereon, and aluminum vapor deposition can be performed on the release agent to produce such a non-leafing vapor-deposited aluminum pigment.

Unlike an ordinary aluminum pigment such as an aluminum flake, the vapor-deposited aluminum pigment has little particle feeling, and thereby, a design layer having a mirror surface-shaped appearance which is like a metal surface can be provided.

It is more preferred that the vapor-deposited aluminum pigment be a non-leafing vapor-deposited aluminum pigment. It is preferred that the particle diameter of the non-leafing vapor-deposited aluminum pigment be 3 to 20 μm and it is preferred that the thickness of the vapor-deposited aluminum film be 0.01 to 0.1 μm. By making the pigment have a particle diameter mentioned above, a metallic tone new design with little particle feeling can be attained. It is more preferred that the particle diameter be 5 to 15 μm. In this connection, the particle diameter in the present specification refers to a value obtained by being measured with a laser diffraction particle size analyzer LA-910 (available from HORIBA Ltd.). Examples of a commercially available non-leafing vapor-deposited aluminum, which can be used in the present disclosure, can include Metasheen 11-0010, 41-0010, 71-0010, 91-0010, MS-750 or MS-650 (available from Ciba Specialty Chemicals), Silverline P1000 or P4100, Metalure L or Metalure A21010BG (available from Eckart GmbH), and the like.

In this connection, a leafing treatment refers to a treatment in which the surface of aluminum is treated with a hydrophobic agent and/or a lipophobic agent. It is preferred that the non-leafing vapor-deposited aluminum pigment used in the present disclosure be a non-leafing vapor-deposited aluminum pigment which has not been subjected to such a leafing treatment. In the case of using leafing vapor-deposited aluminum, the adhesive force thereof to the coating film layer adjacent thereto is lowered and a trouble of adhesion occurs. Accordingly, in the present disclosure, it is preferred that non-leafing vapor-deposited aluminum be used.

The content of the vapor-deposited aluminum pigment is 30 to 85% by weight relative to the whole amount of solid matter in the coating film layer (B-1) containing vapor-deposited aluminum. When being less than 30% by weight, a brilliant coating film satisfying the sense of dense metallic sheen is not obtained, and when being greater than 85% by weight, physical properties of a coating film are lowered. The content of the non-leafing vapor-deposited aluminum pigment is more preferably 40 to 80% by weight.

The coating film layer (B-1) containing vapor-deposited aluminum further contains a binder resin in addition to the non-leafing vapor-deposited aluminum pigment. The binder resin is not particularly limited and examples thereof can include a vinyl chloride resin, an acrylic resin, a urethane resin, a polyester resin and the like, and among these, two or more kinds thereof may be mixed to be used. Of these, a vinyl chloride resin is especially preferred.

As the vinyl chloride resin, one available from the market can be used. The vinyl chloride resin may be a single polymer of vinyl chloride and may be a copolymer of vinyl chloride and an additional vinyl monomer copolymerizable therewith. More specifically, examples of the copolymer can include a copolymer of vinyl chloride and vinyl acetate, maleic anhydride or a kind of ester thereof, vinyl ether, acrylic acid, an acryl-based hydroxyl group-containing monomer and the like.

The polymerization degree of each of these vinyl chloride resins is usually 200 to 2000 and preferably 300 to 1000. Examples of a commercial product of the vinyl chloride resin easily available can include SOLBIN C, CN, A, TA2, TAO, TAOL or M5 available from Nissin Chemical Industry Co., Ltd.; Vinnol H11/59, E15/48A, LL4320 or E15/45M available from Wacker Chemie AG; VYHD, VAGD, VMCH or VMCC available from The Dow Chemical Company UCAR, and the like. Among these, two or more kinds thereof can also be mixedly used.

The coating film layer (B-1) containing vapor-deposited aluminum may be one prepared by being added with an aluminum aggregation preventing agent. In this case, the coating film layer is preferred in the point that cohesive failure between aluminum and the resin can be suppressed by the action of the aluminum aggregation preventing agent. Specifically, as the aluminum aggregation preventing agent, Dianal RE360 (available from MITSUBISHI RAYON CO., LTD.) and the like can be used.

The coating film layer (B-1) containing vapor-deposited aluminum can contain an additional brilliant pigment and/or a colored pigment other than the specific non-leafing vapor-deposited aluminum pigment.

Examples of the additional brilliant pigment include at least one kind of pigment selected from the group consisting of a metal oxide-coated alumina flake pigment, a metal oxide-coated silica flake pigment, a graphite pigment, a metal oxide-coated mica pigment, a metal titanium flake pigment, a stainless steel flake pigment, a sheet-like iron oxide pigment, a metal-plated glass flake pigment, a metal oxide-coated glass flake pigment, a hologram pigment and a flake-like pigment composed of a cholesteric liquid crystal polymer, and more preferred examples thereof include at least one kind of pigment selected from the group consisting of a metal oxide-coated alumina flake pigment, a metal oxide-coated silica flake pigment, a graphite pigment, a metal oxide-coated mica pigment and a metal oxide-coated glass flake pigment.

Examples of the colored pigment include an azo lake-based pigment, a phthalocyanine-based pigment, an indigo-based pigment, a perylene-based pigment, a quinophthalone-based pigment, a dioxadine-based pigment, a quinacridone-based pigment, an isoindolinone-based pigment and a metal complex pigment, and moreover, examples of an inorganic pigment include yellow iron oxide, Bengala (red iron oxide), titanium dioxide and carbon black.

Other than the above-mentioned components, polyethylene wax, a sedimentation-preventing agent, a curing catalyst, an ultraviolet ray absorber, an oxidation inhibitor, a leveling agent, a surface conditioner such as silicone and an organic polymer, a dribble preventing agent, a thickener, a defoaming agent, crosslinkable polymer particles (microgel) and the like can be appropriately added to the metallic base coating for forming the coating film layer (B-1) containing vapor-deposited aluminum to be contained therein. The metallic base coating can be formed into a solvent-based coating, a water-based coating or the like.

It is preferred that the coating film layer (B-1) containing vapor-deposited aluminum have a thickness of 0.05 to 5 µm. When being made to lie outside the above-mentioned range, the layer is not preferred in the point that problems on white turbidity, a split and the like are liable to be generated.

(Vapor-Deposited Metal Layer (B-2) Composed of Indium or Tin)

First, the vapor-deposited metal layer will be described.

Vapor deposition refers to a method of heating a vapor deposition material in a vacuumized vessel to make the vapor deposition material vaporize and making the vapor deposition material stick to the surface of a base material arranged at a position apart therefrom to form a thin film. In the present disclosure, the metal used for vapor deposition is tin or indium. Since a degree of vacuum of $10^{-3}$ to $10^{-4}$ Pa or so is required for the vapor deposition, it is necessary for the inside of a vessel to be once kept at a vacuum state. Therefore, the vapor deposition is performed by a complete batch processing method and cannot be performed by a continuous processing method.

Moreover, in general, a vacuum deposition method for a film includes the steps of (1) setting a film roll and a target metal in a chamber, (2) evacuating the inside of the chamber to a vacuum ($10^{-3}$ to $10^{-4}$ Pa) and making the film start traveling, (3) heating the target to generate vapor and making the metal deposit on the film surface, and (4) releasing the internal pressure of the chamber to the atmosphere after the completion of vapor deposition. As compared with a direct vapor deposition against a part, in spite of being a batch processing method, the economic efficiency is high because a 1-roll portion of the film is continuously processed. Moreover, there is an advantage that the thickness and quality of a vapor-deposited film is easily controlled. However, the film cannot be applied to a three-dimensionally shaped article as it is.

The vapor-deposited metal layer (B-2) composed of indium or tin in the present disclosure can be formed by an ordinary vapor deposition method using each of these metals. Since a metal layer satisfactory in elongation can be obtained by using indium or tin, in the case of being formed into a three-dimensional shape, a split or white turbidity is not generated and the appearance is not adversely affected.

Since a layer composed of indium or tin is used as the vapor-deposited metal layer in the present disclosure, by virtue of the action called discontinuous vapor deposition, the laminated film of the present disclosure has an advantage that a split or white turbidity is hardly generated.

In the case of forming such a vapor-deposited metal layer, it is preferred that the thickness thereof be 0.05 to 5 µm. By making the vapor-deposited metal layer have such a thickness, the above-described objects can be satisfactorily achieved.

(Clear Coating Film Layer (C))

The clear coating film layer (C) used in the present disclosure is composed of an energy ray-curable coating film, the specific composition thereof is not particularly limited as long as the physical properties of the laminated film are not impaired, and a known energy ray-curable coating film can be adopted.

Of these, it is preferred that the clear coating film layer be a layer formed from an active energy ray-curing type coating composition containing a polyurethane acrylate (C1), a monomer/oligomer (C2) having an unsaturated double bond and a polymerization initiator (C3). By adopting the layer with such a composition, since the resulting laminated film is easily stretched when used and can also easily cope with deep drawing, the laminated film satisfactorily follows the three-dimensional shape. Moreover, the resulting laminated film also has an advantage that blocking is hardly generated.

Furthermore, it is preferred that the active energy ray-curing type coating composition contain (C1) in a content lying within the range of 50 to 99 parts by weight and (C2) in a content lying within the range of 1 to 50 part(s) by weight in 100 parts by weight of the total amount ((C1)+(C2)) of the solid content weight of (C1) and the solid content weight of (C2), and (C3) in a content lying within the range of 0.5 to 20 part (s) by weight relative to 100 parts by weight of the total amount ((C1)+(C2)) of the solid content weight of (C1) and the solid content weight of (C2). On this account, the resulting laminated film can have a blocking resistance and deep drawability (stretchability) before curing. Furthermore, the resulting laminated film can have high scratch resistance, surface hardness, chemical resistance and impact resistance after curing.

Hereinafter, (C1) to (C3) will be described in detail.

(Polyurethane Acrylate (C1))

The polyurethane acrylate (C1) is a compound having a urethane bond in its molecule and having a (meth) acrylate group in the molecule. By using this, since the stretchability at the time of performing decorative forming is enhanced and the resulting laminated film can also easily cope with deep drawing, the laminated film satisfactorily follows the three-dimensional shape.

The polyurethane acrylate (C1) is not particularly limited, and any known polyurethane acrylate can be used. Examples thereof include i) a compound obtained by making a compound having two or more isocyanate groups in its molecule and a compound having one or more hydroxyl group(s) and one or more double bond group(s) in its molecule undergo an equivalent reaction, ii) a compound obtained by making a condensate between a polyol and a monobasic acid and/or a polybasic acid and/or an acid anhydride thereof react with a compound having two or more isocyanate groups in its molecule, and then, further making the reaction product react with a compound having one or more hydroxyl group(s) and one or more double bond group(s) in its molecule, and iii) a compound obtained by making a polyol react with a compound having two or more isocyanate groups in its molecule, and then, further making the reaction product react with a compound having one or more hydroxyl group(s) and one or more double bond group(s) in its molecule, and the like.

With regard to i) to iii) mentioned above, examples of the compound having one or more hydroxyl group(s) and one or more double bond group(s) in its molecule include 2-hydroxy(meth)acrylate, 2-hydroxypropyl (meth)acrylate, 4-hydroxybutyl (meth) acrylate, pentaerythritol triacrylate, dipentaerythritol pentaacrylate, and the like, PLACCEL F(M) A series (trade name, Daicel Corporation) as commercial products, and the like. Moreover, with regard to ii) to iii) mentioned above, examples of the polyhydric alcohol include polyethylene glycol, polycarbonate diol, polytetramethylene glycol, trimethylolpropane, and the like, PLACCEL DIOL series (trade name, Daicel Corporation) and PLACCEL TRIOL series (trade name, Daicel Corporation) as commercial products, and the like.

The polyol is not particularly limited, and known acrylic polyol, polyester polyol, polycarbonate polyol and the like can be used. Moreover, various low molecular weight diols such as ethylene glycol, butanediol, glycerin, pentaerythritol and neopentyl glycol, and the like can also be used as necessary.

It is preferred that the polyol have a polycarbonate diol skeleton in a proportion that the polycarbonate concentration becomes 0.5 to 75 wt % (a proportion relative to the whole amount of the polyurethane acrylate (C1)). By using a polyol having a polycarbonate diol skeleton, the toughness is exhibited, and the resulting laminated film has an advantage that swelling at the time of decorative forming can be prevented and the design appearance can be maintained (a split can be prevented).

It is more preferred that the proportion of the polycarbonate diol be 2 to 70% by weight.

The polyisocyanate is not particularly limited as long as the polyisocyanate is a compound having two or more isocyanate groups, and examples thereof can include aromatic compounds such as tolylene diisocyanate, 4,4'-diphenylmethane diisocyanate, xylylene diisocyanate and metaxylylene diisocyanate; aliphatic compounds such as hexamethylene diisocyanate; alicyclic compounds such as isophorone diisocyanate; a monomer thereof, a multimer such as a biuret-type, nurate-type or adduct-type product, and the like.

Examples of a commercial product of the polyisocyanate can include Duranate 24A-90PX (NCO: 23.6%, trade name, available from Asahi Kasei Corp.), Sumidur N-3200-90M (trade name, available from Sumika Covestro Urethane Co., Ltd.), TAKENATE D165N-90X (trade name, available from Mitsui Chemicals, Inc.), Sumidur N-3300, Sumidur N-3500 (any of these is a trade name, available from Sumika Covestro Urethane Co., Ltd.), Duranate THA-100 (trade name, available from Asahi Kasei Corp.), and the like. Moreover, blocked isocyanates prepared by blocking isocyanate groups thereof with blocking agents can also be used, as necessary.

The polyurethane acrylate (C1) may be a compound partially having a urea bond moiety.

In order to make the polyurethane acrylate have a urea bond moiety, some amount of a polyamine compound needs only to be used in the synthesis of polyurethane acrylate. The polyamine compound usable therein is not particularly limited, and examples thereof can include an aliphatic polyamine such as ethylenediamine, trimethylenediamine, tetramethylenediamine, pentamethylenediamine, hexamethylenediamine, triethylenetetramine, diethylenetriamine, triaminopropane, 2,2,4-trimethylhexamethylenediamine, 2-hydroxyethylethylenediamine, N-(2-hydroxyethyl)propylenediamine, (2-hydroxyethylpropylene)diamine, (di-2-hydroxyethylethylene)diamine, (di-2-hydroxyethylpropylene)diamine, (2-hydroxypropylethylene)diamine, (di-2-hydroxypropylethylene)diamine and piperazine; an alicyclic polyamine such as 1,2- or 1,3-cyclobutanediamine, 1,2-, 1,3- or 1,4-cyclohexanediamine, isophorone diamine (IPDA), methylenebiscyclohexane 2,4'- and/or 4,4'-diamine, and norbornanediamine; an aromatic diamine such as phenylenediamine, xylylenediamine, 2,4-tolylenediamine, 2,6-tolylenediamine, diethyltoluenediamine, 3,3'-dichloro-4,4'-diaminodiphenylmethane and 4,4-bis-(sec-butyl) diphenylmethane; a dimer diamine prepared by converting carboxyl groups of a dimer acid into amino groups, a dendrimer having a primary or secondary amino group at the terminal, and the like.

It is preferred that the double bond equivalent of the polyurethane acrylate (C1) be 130 to 600 g/eq, and it is further preferred that the double bond equivalent thereof be 150 to 300 g/eq. When the double bond equivalent is less than 130 g/eq, there is a fear that a problem in which the cured film is poor in crack resistance and impact resistance occurs. When the double bond equivalent is greater than 600 g/eq, there is a fear that a problem in which the resulting laminated film is poor in the scratch property, surface hardness and chemical resistance occurs.

It is preferred that the weight average molecular weight of the polyurethane acrylate (C1) be 3000 to 200000. When the weight average molecular weight is less than 3000, there is a fear that a problem in which the resulting laminated film is poor in blocking resistance occurs. When the weight average molecular weight is greater than 200000, the compatibility between the resulting polyurethane acrylate (C1) and a monomer/oligomer (C2) having an unsaturated double bond or the like contained in a clear coating composition is lowered. In addition, when the weight average molecular weight is greater than 200000, there is a tendency for the viscosity of a clear coating composition to be increased. Moreover, when a clear coating composition is diluted with an organic solvent in order to improve such an increase in viscosity, there is a fear that a problem in which the solid content in the clear coating composition is significantly lowered and the processability deteriorates occurs. In this connection, in the present specification, the weight average molecular weight was measured by a method described below.

It is preferred that the urethane concentration of the polyurethane acrylate (C1) be 300 to 2000 g/eq. When the urethane concentration is less than 300 g/eq, the compatibility between the resulting polyurethane acrylate (C1) and a monomer/oligomer (C2) having an unsaturated double bond or the like contained in a clear coating composition is lowered. In addition, when the urethane concentration is less than 300 g/eq, there is a tendency for the viscosity of a clear coating composition to be increased. Moreover, when a clear coating composition is diluted with an organic solvent in order to improve such an increase in viscosity, there is a fear that a problem in which the solid content in the clear coating composition is significantly lowered and the processability deteriorates occurs. When the urethane concentration is greater than 2000 g/eq, there is a fear that a problem in which the resulting laminated film is poor in blocking resistance and impact resistance occurs.

It is preferred that the urea concentration of the polyurethane acrylate (C1) be 500 to 1000 g/eq. When the urea concentration is less than 500 g/eq, the compatibility between the resulting polyurethane acrylate (C1) and a monomer/oligomer (C2) having an unsaturated double bond or the like contained in a clear coating composition is lowered. In addition, when the urea concentration is less than 500 g/eq, there is a tendency for the viscosity of a clear coating composition to be increased. Moreover, when a clear coating composition is diluted with an organic solvent in order to improve such an increase in viscosity, there is a fear that a problem in which the solid content in the clear coating composition is significantly lowered and the processability deteriorates occurs. When the urea concentration is greater than 1000 g/eq, there is a fear that a problem in which the resulting laminated film is poor in blocking resistance occurs.

The polyurethane acrylate (C1) may be a fluorine- and/or silicone-modified polyurethane acrylate. That is, the polyurethane acrylate (C1) may be a polyurethane acrylate synthesized by the above-described method using a monomer containing a fluorine or silicone unit, and may be a polyurethane acrylate obtained by making a functional group of the polyurethane acrylate (C1), which is obtained by the above-described method, react with a compound having a fluorine moiety and/or a silicone moiety.

(Monomer/Oligomer (C2) Having Unsaturated Double Bond)

As the monomer/oligomer (C2) having an unsaturated double bond, any known monomer/oligomer can be used, and for example, the following compounds can be used.

Examples of a (meth)acrylate with a functional group number of 2 include 1,4-butanediol di(meth)acrylate, 1,3-butanediol di(meth)acrylate, 1,6-hexanediol di(meth)acrylate, ethylene glycol di(meth)acrylate, diethylene glycol di(meth)acrylate, triethylene glycol di(meth)acrylate, polyethylene glycol di(meth)acrylate, dipropylene glycol di(meth)acrylate, tripropylene glycol di(meth)acrylate, polypropylene glycol di(meth)acrylate, neopentyl glycol di(meth)acrylate, hydroxypivalic acid neopentyl glycol di(meth)acrylate, 1,6-hexanediol di(meth)acrylate, 1,9-nonanediol di(meth)acrylate, 1,10-decanediol di(meth)acrylate, glycerin di(meth)acrylate, dimethyloltricyclodecane di(meth)acrylate, and the like. Of these, ethylene glycol di(meth)acrylate, diethylene glycol di(meth)acrylate, and the like can be preferably used.

Examples of a (meth)acrylate with a functional group number of 3 include trimethylolmethane tri(meth)acrylate, trimethylolpropane tri(meth)acrylate, trimethylolpropane ethylene oxide-modified tri(meth)acrylate, trimethylolpropane propylene oxide-modified tri(meth)acrylate, pentaerythritol tri(meth)acrylate, glycerin propoxytri(meth)acrylate, tris(2-(meth)acryloyloxyethyl)isocyanurate, and the like. Of these, trimethylolpropane trimethacrylate, pentaerythritol trimethacrylate, and the like can be preferably used.

Examples of a (meth)acrylate with a functional group number of 4 include dipentaerythritol tetra(meth)acrylate, pentaerythritol tetra(meth)acrylate, pentaerythritol ethylene oxide-modified tetra(meth)acrylate, pentaerythritol propylene oxide-modified tetra(meth)acrylate, ditrimethylolpropane tetra(meth)acrylate, and the like. Of these, ditrimethylolpropane tetra(meth)acrylate, pentaerythritol tetra(meth)acrylate, and the like can be preferably used.

Examples of a (meth)acrylate with a functional group number of 4 or more include polyfunctional (meth)acrylates such as pentaerythritol tetra(meth)acrylate, pentaerythritol ethylene oxide-modified tetra(meth)acrylate, ditrimethylolpropane tetra(meth)acrylate, dipentaerythritol tetra(meth)acrylate, dipentaerythritol penta(meth)acrylate, ditrimethylolpropane penta(meth)acrylate, propionic acid-modified dipentaerythritol penta(meth)acrylate, dipentaerythritol hexa(meth)acrylate, ditrimethylolpropane hexa(meth)acrylate, and a hexa(meth)acrylate of a caprolactone-modified product of dipentaerythritol. One kind of these monomers may be used alone, and two or more kinds thereof may be combinedly used.

Examples of the (meth)acryl-based oligomer include an epoxy (meth)acrylate, a polyester (meth)acrylate, a urethane (meth)acrylate, and the like. In this context, for example, the polyester acrylate-based prepolymer can be obtained by esterifying hydroxyl groups of a polyester oligomer having hydroxyl groups at both terminals, which is obtained by condensation between a polycarboxylic acid and a polyhydric alcohol, with (meth)acrylic acid or by esterifying a hydroxyl group of an oligomer at a terminal, which is obtained by subjecting a polycarboxylic acid to an addition reaction with an alkylene oxide, with (meth)acrylic acid. For example, the epoxy acrylate-based prepolymer can be obtained by making an oxirane ring of a bisphenol type epoxy resin or novolak type epoxy resin with a relatively low molecular weight react with (meth)acrylic acid to be esterified. In general, a urethane acrylate can be obtained by making a product, which is obtained by making a polyester polyol, polyether polyol or polycarbonate polyol react with an isocyanate monomer or isocyanate prepolymer, react with an acrylate monomer having a hydroxyl group.

One kind of these (meth) acryl-based oligomers may be used alone, and two or more kinds thereof may be combinedly used, and moreover, the (meth)acryl-based oligomer may be used in combination with the polyfunctional (meth)acrylate-based monomer.

As the monomer/oligomer (C2) having an unsaturated double bond, a commercially available monomer/oligomer such as UV 1700B available from The Nippon Synthetic Chemical Industry Co., Ltd. can also be used.

(Polymerization Initiator (C3))

As the polymerization initiator (C3), energy ray polymerization initiators with which the polymerization is initiated by electromagnetic radiations such as ultraviolet rays (UV) and an electron beam can be used. These energy ray polymerization initiators are not particularly limited, and any known energy ray polymerization initiator can be used.

Specifically, examples of the energy ray polymerization initiator can include a benzoin-based compound such as benzoin methyl ether; an anthraquinone-based compound such as 2-ethylanthraquinone; a benzophenone-based compound such as benzophenone; a sulfide-based compound such as diphenyl sulfide; a thioxanthone-based compound such as 2,4-dimethylthioxanthone; an acetophenone-based compound such as 2,2-dimethoxy-2-phenylacetophenone; a phosphinoxide-based compound such as 2,4,6-trimethylbenzoin diphenylphosphinoxide; a polymerization initiator for ultraviolet ray (UV) curing such as IRGACURE (registered trademark) -184 and IRGACURE-819 (any of these is available from BASF Japan Ltd.), and the like. As the polymerization initiator, one kind of these compounds or two or more kinds thereof can be used.

(Blending Amounts of (C1) to (C3))

It is preferred that the active energy ray-curing type coating composition contain (C1) in a content lying within the range of 50 to 99 parts by weight and (C2) in a content lying within the range of 1 to 50 part (s) by weight in 100 parts by weight of the total amount ((C1)+(C2)) of the solid content weight of (C1) and the solid content weight of (C2), and (C3) in a content lying within the range of 0.5 to 20 part (s) by weight relative to 100 parts by weight of the total amount ((C1)+(C2)) of the solid content weight of (C1) and the solid content weight of (C2).

When the content of the polyurethane acrylate (C1) is less than 50 parts by weight, the resulting laminated film is not preferred in the point that the blocking resistance is lowered. When the content of the polyurethane acrylate (C1) is greater than 99 parts by weight, the resulting laminated film is not preferred in the point that the scratch resistance and surface hardness become insufficient. It is more preferred that the lower limit be greater than or equal to 55 parts by weight, and it is further preferred that the lower limit be greater than or equal to 65 parts by weight. It is more preferred that the upper limit be less than or equal to 98 parts by weight, and it is further preferred that the upper limit be less than or equal to 95 parts by weight.

When the content of the monomer/oligomer (C2) having an unsaturated double bond is less than 1 part by weight, the resulting laminated film is not preferred in the point that the scratch resistance and surface hardness become insufficient. When the content of the monomer/oligomer (C2) having an unsaturated double bond is greater than 50 parts by weight, the resulting laminated film is not preferred in the point that the blocking resistance is lowered. It is more preferred that the lower limit be greater than or equal to 2 parts by weight, and it is further preferred that the lower limit be greater than or equal to 5 parts by weight. It is more preferred that the upper limit be less than or equal to 45 parts by weight, and it is further preferred that the upper limit be less than or equal to 35 parts by weight.

When the content of the polymerization initiator (C3) is less than 0.5 parts by weight, the clear layer fails to be sufficiently cured, and there is a possibility that a clear coating film satisfactory in physical properties such as scratch resistance, surface hardness, chemical resistance and impact resistance fails to be obtained. When the content of the polymerization initiator (C3) is greater than 20 parts by weight, the unreacted polymerization initiator (C3) remains in the resulting clear coating film, and there is a possibility that the clear coating film is deteriorated due to outdoor sunlight and the like and the weather resistance becomes poor.

It is preferred that the clear coating composition contain a monomer having a thiol group and/or an amine group in an amount of 0.5 to 20 part(s) by weight.

The monomer having a thiol group and/or an amine group is not particularly limited, and examples thereof can include a thiol compound and an amine compound which are usually used.

As the amine compound, an aliphatic polyamine such as ethylenediamine, trimethylenediamine, tetramethylenediamine, pentamethylenediamine, hexamethylenediamine, triethylenetetramine and diethylenetriamine; an alicyclic polyamine such as 1,2- or 1,3-cyclobutanediamine, 1,2-, 1,3- or 1,4-cyclohexanediamine, isophorone diamine (IPDA), methylenebiscyclohexane 2,4'- and/or 4,4'-diamine, and norbornanediamine; an aromatic amine such as phenylenediamine, xylylenediamine, 2,4-tolylenediamine, 2,6-tolylenediamine, diethyltoluenediamine and 4,4-bis-(sec-butyl) diphenylmethane; a dimer acid diamine prepared by converting carboxyl groups of a dimer acid into amino groups, a dendrimer having an amino group at the terminal, or a polyamine having an amine moiety as a repeating structural unit can be used, but the amine compound is not limited thereto.

Examples of the thiol compound include bifunctional thiols such as 1,4-bis(3-mercaptobutyryloxy)butane, ethylene glycol dimercaptopropionate, diethylene glycol dimercaptopropionate, 4-t-butyl-1,2-benzenedithiol, bis-(2-mercaptoethyl)sulfide, 4,4'-thiodibenzenethiol, benzenedithiol, glycol dimercaptoacetate, glycol dimercaptopropionate, ethylenebis(3-mercaptopropionate), polyethylene glycol dimercaptoacetate, polyethylene glycol di-(3-mercaptopropionate), 2,2-bis(mercaptomethyl)-1,3-propanedithiol, 2,5-dimercaptomethyl-1,4-dithiane, bisphenofluorene bis(ethoxy-3-mercaptopropionate), 4,8-bis(mercaptomethyl)-3,6,9-trithia-1,11-undecanedithiol, 2-mercaptomethyl-2-methyl-1,3-propanedithiol, 1,8-dimercapto-3,6-dioxaoctane and thioglycerolbismercapto-acetate; trifunctional thiols such as trimethylolpropane(trismercaptopropionate) (TMPTMP), trimethylolpropane tris(3-mercaptobutyrate), trimethylolpropane tris(3-mercaptopropionate), trimethylolethane tris(3-mercaptobutyrate), trimethylolpropane tris(3-mercaptoacetate), tris(3-mercaptopropyl)isocyanurate, 1,3,5-tris (3-mercaptobutyryloxyethyl)-1,3,5-triazin-2,4,6-(1H, 3H, 5H)-trione, 1,2,3-mercaptopropane and tris (3-mercaptopropionate)triethyl-1,3,5-triazin-2,4,6-(1H, 3H, 5H)-trione; and polyfunctional thiols such as poly (mercaptopropylmethyl) siloxane (PMPMS), 4-mercaptomethyl-3,6-dithia-1,8-octanedithiol, pentaerythritol tetrakis(3-mercaptoacetate), pentaerythritol tetrakis(3-mercaptopropionate), dipentaerythritol hexakis(3-mercaptopropionate) and pentaerythritol tetrakis(3-mercaptobutyrate), but the thiol compound is not limited thereto.

Further preferably, it is preferred that the clear coating film layer (C), which is described above, used in the laminated film for decorating a three-dimensional molded product according to the present disclosure be a clear coating film layer formed from a coating composition in which the polyurethane acrylate (C1) satisfies the requirements of the double bond equivalent: 130 to 600 g/eq,
the molecular weight Mw: 3000 to 200000 and
the urethane concentration: 300 to 2000 g/eq. It is preferred that a polyurethane acrylate satisfying these requirements be used. When a clear coating film layer (C) is formed from such a clear coating composition, the clear coating film layer (C) is preferred because the resulting laminated film can be imparted with satisfactory blocking resistance, high scratch resistance, satisfactory surface hardness and satisfactory impact resistance. Furthermore, it is preferred that the polyurethane acrylate (C1) satisfy the requirement of the urea concentration: 500 to 1000 g/eq.

In this connection, the weight average molecular weight in the present specification was measured by means of the HLC-82220GPC available from Tosoh Corporation. The measurement conditions are as follows.

Column: Three TSKgel Super Multipore HZ-M columns
Developing solvent: Tetrahydrofuran
Column injection port oven 40° C.
Flow rate: 0.35 ml/min.
Detector: RI
Standard polystyrene: Tosoh Corporation PS oligomer kit
(Additional Components)

In a clear coating composition, a compound which is usually added as a coating material may be contained as an additional component. Examples of the additional component can include an ultraviolet ray absorber (UVA), a photostabilizer (HALS (hindered amine light stabilizer)), a resin for binder, a crosslinking agent, a pigment, a surface conditioner, a defoaming agent, a conductive filler, a solvent and the like.

Furthermore, a solvent may be used for the purposes of mixing the respective components to be contained in the clear coating composition and the viscosity control of the component. As the solvent, for example, one kind of conventionally known organic solvents such as ester-based, ether-based, alcohol-based, amide-based, ketone-based, aliphatic hydrocarbon-based, alicyclic hydrocarbon-based and aromatic hydrocarbon-based solvents which are used for a coating may be used alone or these organic solvents may be used in combination of two or more kinds thereof. In this connection, in the case of using the solvent, when a volatile substance is left behind in a laminated film, there are cases where the volatile substance volatilizes and transpires at the time of decorating a base material to generate pinholes and swelling. As such, it is preferred that the volatile substance contained in the laminated film be sufficiently reduced.

Furthermore, it is preferred that the clear coating composition further contain inorganic/organic filler with an average primary particle diameter of less than or equal to 100 nm in an amount of 0.5 to 60 part(s) by weight. On this account, it is possible to improve the blocking resistance, high scratch resistance and surface hardness. It is more preferred that the lower limit of the blending amount be 1% by weight, and it is more preferred that the upper limit thereof be 50% by weight.

Examples of the inorganic filler include silica, impalpable powder of glass, alumina, calcium carbonate, kaolin, clay, sepiolite (magnesium silicate), talc (magnesium silicate), mica (aluminum silicate), xonotlite (calcium silicate), aluminum borate, hydrotalcite, wollastonite (calcium silicate), potassium titanate, titanium oxide, barium sulfate, magnesium sulfate, magnesium hydroxide, yttria, ceria, silicon carbide, boron carbide, zirconia, aluminum nitride, silicon nitride or a eutectic mixture thereof, or a nonmetallic inorganic material obtained after subjected to molding, firing or the like, the so-called ceramic filler. Of these, from aspects of the price and the effect, silica, alumina, zirconia or a eutectic mixture thereof is preferred.

Examples of the organic filler include beads of the respective resins of acryl, styrene, silicone, polyurethane, acrylic urethane, benzoguanamine and polyethylene.

Moreover, as a commercially available one, organosilica sol MIBK-ST, MEK-ST-UP, MEK-ST-L or MEK-AC-2140Z (available from Nissan Chemical Industries, Ltd.), SIRMIBK15ET %-H24, SIRMIBK15ET %-H83 or ALMIBK30WT %-H06 (CIK Nanotek Corporation) or the like can be used.

The clear coating composition may be a clear coating composition containing a polyisocyanate compound having an isocyanate group in an amount of 0.5 to 20% by weight (solid content ratio in the coating). When the polyisocyanate compound is blended thereinto, the clear coating composition is preferred in the point that the resulting laminated film can be imparted with formability (stretchability) and scratch resistance. It is more preferred that the lower limit of the blending amount be 2% by weight, and it is more preferred that the upper limit thereof be 18% by weight.

The clear coating composition may be a colored transparent clear coating composition in which a colored pigment is contained. That is, by virtue of the combination of a metallic tone design layer and such a chromatic transparent clear layer, it is possible to perform decorating by which a chromatic metallic tone design is imparted. The colored pigment which can be used in the clear coating composition is not particularly limited, and any known colored pigment can be used.

(Base Material Film Layer (D))

The base material film layer (D) is a layer playing a role of a carrier film at the time of producing the laminated film of the present disclosure. That is, at the time of producing the laminated film for decorating a three-dimensional molded product according to the present disclosure, the base material film layer is a layer used as a base material for forming the respective layers. Moreover, in embodiments shown in FIGS. 3 and 4 described above, there is also a case in which a base material film layer exists on the three-dimensional molded product even after the decorative treatment. In this case, the base material film layer not only plays a role as merely a base material but also exerts a function such as a surface protecting function.

A film forming the base material film layer (D) is not particularly limited, and examples thereof include conventionally known films such as a flexible vinyl chloride film, a non-stretched polypropylene film, a non-stretched polyester film, a polycarbonate film, an acrylic resin film and a fluorine film. Of these, a film formed from a polyester and/or a polyolefin is preferred, and in particular, a non-stretched polyester film is more preferred from the point of energy saving low-temperature processability. It is preferred that the thickness of the base material film layer (D) be 0.01 to 0.5 mm, and it is more preferred that the thickness thereof be 0.02 to 0.3 mm. When the thickness thereof lies outside this range, the base material film layer is not preferred in the points of a function as the carrier film and an economic aspect at the time of electromagnetic radiation curing.

(Release Layer (E))

As the release layer (E) in the present disclosure, any known release layer can be used, and for example, the release layer can be formed from a silicone-based release agent and the like.

It is preferred that the peel strength between the release layer (E) and the clear coating film layer (C) be 0.05 to 8.0 N/25 mm, and it is further preferred that the peel strength therebetween be 0.1 to 5.0 N/25 mm. When being less than 0.05 N/25 mm, for example, the base material film layer (D) peels off at the time of the film production or decorative forming, these layers are poor in workability, and moreover, when being greater than 8.0 N/25 mm, when peeling off a film after forming, there is a fear that the film becomes difficult to be peeled off.

(Protective Layer (F))

The laminated film for decorating a three-dimensional molded product according to the present disclosure may be a laminated film in which a protective layer (F) is further formed so as to be made adjacent to the metallic tone design layer (B). That is, in the case of providing a metallic tone design layer (B) at a position where the metallic tone design layer (B) is in contact with a clear coating film layer (C), the metallic tone design layer (B) moves when the clear coating film layer (C) in an uncured state moves due to being stretched in the uncured state, and there are cases where this causes deterioration in appearance.

Furthermore, in the case where the metallic tone design layer (B) is constituted of a vapor-deposited metal layer (B-2) composed of indium or tin, in the production thereof, there are cases where the vapor-deposited metal layer is difficult to be formed on the clear coating film layer (C) in an uncured state. Accordingly, also from the viewpoint of reducing such problems, it is desirable that a protective layer (F), which makes the vapor deposition property satisfactory, be provided to improve such problems.

Moreover, there is also a case in which the metallic tone design layer (B) is poor in adhesivity to another layer. As such, it is also preferred that a protective layer (F) made of a raw material excellent in adhesivity to another raw material be formed, and on the protective layer (F), a metallic tone design layer (B) be formed to enhance the adhesivity to another layer. On this account, for example, adhesivities to a clear coating film layer (C) in the embodiment of FIG. 2 and to a base material film layer (D) in the embodiment of FIG. 4 can be improved.

The protective layer (F) is not particularly limited, and for example, resins such as an acrylic resin, a vinyl chloride-vinyl acetate copolymer, a polyamide resin, a polyester resin, a urethane resin, an epoxy resin and a styrene resin can be used, a urethane resin is preferred, and a urea bond-containing urethane resin is further preferred. One kind thereof can be used alone or two or more kinds thereof can be combinedly used to be blended.

(Design Layer (G) Formed by Printing)

The laminated film for decorating a three-dimensional molded product according to the present disclosure may be a laminated film having a design layer (G) formed by printing. When such a layer is provided, the resulting laminated film is preferred in the point that a specific appearance attributed to the combination of a printing layer and a metallic tone design layer can be attained. The method for printing is not particularly limited, and the design layer can be formed by a known method such as inkjet printing, screen printing, offset printing or flexographic printing. In particular, when inkjet printing is adopted, the resulting laminated film is preferred in the point that various printing layers can be formed inexpensively. Moreover, at the time of printing, an energy ray-curing type ink may be used to perform printing.

(Ultraviolet Ray-Absorbing Layer (H))

It is preferred that the ultraviolet ray-absorbing layer (H) be a layer formed from a coating composition containing a binder resin (H-1) and an ultraviolet ray absorber (H-2).

The binder resin (H-1) is not particularly limited, and resins such as an acrylic resin, a vinyl chloride-vinyl acetate copolymer, a polyamide resin, a polyester resin, a urethane resin, an epoxy resin and a styrene resin can be used, a urethane resin is preferred, and a urea bond-containing urethane resin is further preferred. One kind thereof can be used alone or two or more kinds thereof can be combinedly used to be blended.

It is preferred that the content thereof lie within the range of 85 to 99% by weight relative to the whole amount of the ultraviolet ray-absorbing layer (H).

The ultraviolet ray absorber (H-2) is not particularly limited, and for example, a triazine-based ultraviolet ray absorber, a benzophenone-based ultraviolet ray absorber, a benzotriazole-based ultraviolet ray absorber, a cyanoacrylate-based ultraviolet ray absorber, a hydroxybenzoate-based ultraviolet ray absorber and the like can be used.

(Breaking Elongation)

It is preferred that the laminated film for decorating a three-dimensional molded product according to the present disclosure be a laminated film having a breaking elongation of 30 to 400% at 40 to 130° C. before curing. That is, by making a laminated film have such a breaking elongation within the above-mentioned temperature range, the laminated film can easily cope with deep draw forming and effects of the present disclosure can be suitably attained. Components for the respective layers constituting the film can be adjusted to make the breaking elongation lie within such a numerical value range. In the present disclosure, "having a breaking elongation of 30 to 400% at 40 to 130° C." means enabling sufficient stretchability to be attained by making the temperature region in which the breaking elongation of 30 to 400% is exhibited lie within a range of 40 to 130° C. and performing the forming at a temperature within the range.

In this connection, the breaking elongation refers to a value obtained by measuring a laminated film in a state of including a base material film layer (D) at a tensile speed of 50 mm/min within the temperature range of 40 to 130° C. by means of the Autograph AG-IS available from SHIMADZU CORPORATION to measure the elongation at the point of time when any of the layers is broken. Depending on the nature of the film, the breaking elongation needs only to lie within the above-described range at any arbitrary temperature within the range of 40 to 130° C.

(Production Method of Laminated Film)

The respective layers, other than the metallic tone design layer (B) and the base material film layer (D), which constitute the laminated film for decorating a three-dimensional molded product according to the present disclosure can be formed by dissolving the component constituting each layer in a solvent to prepare a coating composition, applying the coating composition on a base material film layer (D) and drying the coating film.

Hereinafter, several examples of a more specific method will be presented, but these production methods are merely illustrative, and the laminated film for decorating a three-dimensional molded product according to the present disclosure and the production method thereof should not be limited to the specific examples shown below.

More specifically, for example, the laminated film can be obtained by a production method including:

the step (1-1) of forming a clear coating film layer (C) composed of an energy ray-curable coating film on a base material film layer (D), the step (1-2) of forming a metallic tone design layer (B) constituted of a coating film layer (B-1) containing vapor-deposited aluminum or a vapor-deposited metal layer (B-2) composed of indium or tin on the film subjected to the step (1-1), and the step (1-3) of forming an adhesion layer (A) on the film obtained by the step (1-2).

Moreover, the production method may be a production method further including the step (1-4) of forming a design layer (G) by printing after performing the step (1-1) and before performing the step (1-2).

The application method for forming each layer mentioned above is not particularly limited, and for example, the spray application by spraying may be performed and the application may be performed by means of an applicator, a die coater, a bar coater, a roll coater, a comma coater, a roller brush, a paintbrush, a spatula or the like. After a coating solution is applied by the application method, in order to remove the solvent in the coating solution, the coating solution as a coating film is subjected to drying by heating and the coating film can be formed into each layer.

Moreover, as described above, with regard to the adhesion layer (A), without adopting the method of coating/drying, a method of bonding as a lamination method may be adopted. That is, a laminated film may be formed by a method of preparing a film formed from an adhesion layer (A) and making this film bond to a film by a lamination technique. Furthermore, a laminated film may be formed by a method of preparing a laminated film composed of an adhesion layer (A) and a metallic tone design layer (B) and laminating this film on a separately prepared composite multilayer film having a base material film layer (D) and a clear coating film layer (C). Furthermore, in the case of being produced according to such a method, a separately prepared laminated film composed of a base material film layer (D), a clear coating film layer (C) and a protective layer (F) is adopted as the composite multilayer film, and a film may be prepared by the same production method as above.

This can be expressed as a series of more specific steps, and may be a method including:

the step (2-1) of forming a clear coating film layer (C) composed of an energy ray-curable coating film on a base material film layer (D), the step (2-2) of forming an adhesion layer (A) and a metallic tone design layer (B) constituted of a coating film layer (B-1) containing vapor-deposited aluminum or a vapor-deposited metal layer (B-2) composed of indium or tin on a base material film layer (X) separately, and the step (2-3) of bonding the film obtained in the step (2-1) and the film obtained in the step (2-2) together.

In this connection, in the case of preparing a laminated film for decorating a three-dimensional molded product by such a method, the base material film layer (X) and the base material film layer (D) described above may be different from each other and may be the same as each other. Furthermore, peeling may be performed after the preparation of the laminated film for decorating a three-dimensional molded product or in any step during the course of the preparation, and in a final product, the base material film (D) and the base material film (X) may exist on both faces thereof, respectively.

In the case where the metallic tone design layer (B) is constituted of a vapor-deposited metal layer (B-2) composed of indium or tin, it is necessary to perform the formation of a vapor-deposited metal layer. The method of forming such a vapor-deposited metal layer is not particularly limited, and the formation can be performed by a conventional known method.

(Usage)

In the case of decorating a base material with the laminated film for decorating a three-dimensional molded product according to the present disclosure, the decorating needs only to be similarly performed according to a conventionally known procedure, and the method is not particularly limited. That is, the base material film layer (D) is peeled off from the laminated film as necessary, and the laminated film is press-bonded to a base material so that the adhesion layer faces the base material surface and the laminated film is brought into close contact with the base material surface to perform the decorating. Afterward, electromagnetic irradiation or heating is performed and the respective layers are cured to obtain a coating film. Moreover, in the case of a composite multilayer film with a layer constitution shown in FIG. 1 or FIG. 2, the base material film layer (D) may be peeled off after press-bonding and curing. In this connection, in the case where a laminated film is brought into close contact with the base material surface, vacuum forming, heating by injection molding, molding and the like can be performed. Moreover, in the case of the embodiment of FIG. 3 or FIG. 4, the base material film layer (D) is not required to be peeled off.

In the case of adopting a vacuum forming technique when the laminated film according to the present disclosure is used, at the time of forming, it is preferred that bonding be performed under the vacuum condition in which the degree of vacuum between the base material and the film is less than or equal to 70 kPa. When forming is performed at such a degree of vacuum, the forming method is preferred in the point that air does not enter the clearance between the adhesion layer (A) and the molded body and highly-adhesive decorating can be performed.

Moreover, decorative forming is performed at a temperature making the elongation of the laminated film become 30 to 400%, and it is preferred that the temperature be selected within the temperature range of 40 to 130° C. On this account, satisfactory vacuum forming can be performed because the laminated film can suitably cope with a highly-elongated state.

In this connection, a base material which can be suitably decorated with the laminated film according to the present disclosure is not particularly limited, and examples thereof can include an automobile exterior part such as a bumper, a front under spoiler, a rear under spoiler, a side under skirt, a side garnish and a door mirror, an automobile interior part such as an instrument panel, a center console and a door switch panel, a housing for a mobile phone, an audio product, a home electric appliance such as a refrigerator, a fan heater and a lighting apparatus, a washstand dressing table, or the like.

EXAMPLES

Hereinafter, the present disclosure will be described by reference to examples. In examples, with regard to the blending proportion, % means % by weight unless otherwise stated. The present disclosure is not limited to the examples described below.

(Synthesis Example Synthesis of Polyurethane)

A reaction vessel equipped with a stirrer, a reflux condenser, a thermometer, an air inlet tube and a material input port was prepared.

While the inside of the reaction vessel was replaced with air, 200.0 g of a polyhexamethylene carbonatediol (trade name "Duranol T6001", available from Asahi Kasei Chemicals Corp., the number average molecular weight by terminal functional group quantitative determination =1,000), 80.0 g of 1,4-butanediol and 120.0 g of a mixture (the hydroxyl value of 102.9 mgKOH/g) of dipentaerythritol pentaacrylate and pentaerythritol hexaacrylate were placed into the reaction vessel.

Then, 238.1 g of methyl ethyl ketone (MEK) as a solvent was placed thereinto. After the contents in the system were homogenized, 314.2 g of 4,4'-methylenebis-cyclohexyldiisocyanate was placed thereinto at 50° C., dibutyltin laurylate was used as a catalyst, and the contents were allowed to undergo a reaction at 80° C. The viscosity of the reaction liquid was adjusted by dilution with the solvent, and the reaction was made to proceed until the disappearance of the absorption at 2,270 $cm^{-1}$ of the free isocyanate group measured by the infrared absorption spectral analysis is confirmed. Cyclohexane was added until the mass ratio of MEK to cyclohexanone becomes 1:1 to obtain a resin solution containing polyurethane.

The viscosity of the resin solution obtained, the solid content thereof and the double bond equivalent were determined to be 200 dPa·s/20° C., 45% and 600 g/eq, respectively. Moreover, the weight average molecular weight of polyurethane measured by GPC was determined to be 44,000.

[Production Example of Laminated Film]

<Preparation of Clear Coating Solution>

In a vessel equipped with a stirrer, a polyurethane acrylate (C1) and a monomer (C2) were placed, MEK in an amount that the final coating has a value of NV=40% was placed therein while stirring, furthermore, a polymerization initiator (C3) was placed therein, and the contents were stirred for 30 minutes to obtain a clear coating solution.

<Preparation of Vapor-Deposited Aluminum-Containing Coating Solution>

In a vessel equipped with a stirrer, a binder resin (B1) and vapor-deposited aluminum (B2) were placed, MIBK in an amount that the final coating has a value of NV=2% was placed therein while stirring, and the contents were stirred for 30 minutes to obtain a vapor-deposited aluminum-containing coating solution.

<Preparation 1 of Laminated Film>

A release layer (E) was formed on a base material film layer (D), on the release layer (E), the clear coating solution was applied by means of an applicator so that a clear coating film layer (C) with a film thickness after drying (hereinafter, dried film thickness) of 20 μm is obtained, and the film was dried for 15 minutes at 80° C. to form the clear coating film layer (C).

In this connection, hereinbelow, a film prepared by forming a clear coating film layer (C) above a base material film layer (D) is described as a (D+C) layer film.

Then, on the clear coating film layer (C) of the (D+C) layer film, the vapor-deposited aluminum-containing coating solution was applied by means of a bar coater so that a metal design layer (B) with a prescribed dried film thickness is obtained, after which the film was dried for 15 minutes at 80° C. to form a metal vapor-deposited layer (B).

Subsequently, on the metal design layer (B), an adhesive agent (VYLON UR-3200, available from TOYOBO CO., LTD. or UR-1361ET, available from TOAGOSEI CO., LTD.) was applied by means of an applicator so that an adhesive layer with a dried film thickness of 20 μm is obtained, and the film was dried for 15 minutes at 80° C. to form the adhesive layer.

<Preparation 2 of Laminated Film; Preparation 2 of Film with Laminated Structure Shown in FIG. 2 (Example 8)>

In the formation of an adhesion layer (A), a film composed of the adhesion layer was prepared, and by a lamination method using the MRK-650Y available from MCK CO., LTD., this film was made to bond to a laminated film composed of (B) to (E) layers obtained by the above-described method to obtain a laminated film. Laminating was performed under the following conditions.

Heat-resistant silicone rubber covered roll with a diameter of 80 mm

Temperature: 85° C., Speed: 42 cm/min

<Preparation 3 of Laminated Film>

On a base material film layer (D), the clear coating solution was applied by means of an applicator so that a clear coating film layer (C) with a film thickness after drying (hereinafter, dried film thickness) of 20 μm is obtained, and the film was dried for 15 minutes at 80° C. to form the clear coating film layer (C).

In this connection, hereinbelow, a film prepared by forming a clear coating film layer (C) on a base material film layer (D) is described as a (D+C) layer film.

Then, on the opposite side of the clear coating film layer (C) of the (D+C) layer film, the vapor-deposited aluminum-containing coating solution was applied by means of a bar coater so that a metal design layer (B) with a prescribed dried film thickness is obtained, after which the film was dried for 15 minutes at 80° C. to form the metal design layer (B).

Subsequently, on the metal design layer (B), an adhesive agent (VYLON UR-3200, available from TOYOBO CO., LTD. or UR-1361ET, available from TOAGOSEI CO., LTD.) was applied by means of an applicator so that an adhesive layer with a dried film thickness of 20 μm is obtained, and the film was dried for 15 minutes at 80° C. to form the adhesive layer.

<Preparation 4 of Laminated Film>

In a vessel equipped with a stirrer, a binder resin (H1) and an ultraviolet ray absorber (H2) were placed, MEK in an amount that the final coating has a value of NV=40% was placed therein while stirring, and the contents were stirred for 30 minutes to obtain an ultraviolet ray-absorbing coating solution.

In the case of providing an ultraviolet ray-absorbing layer, the ultraviolet ray-absorbing coating solution was applied by means of an applicator so that an ultraviolet ray-absorbing layer (H) with a film thickness after drying (hereinafter, dried film thickness) of 20 μm is obtained, after which the film was dried for 15 minutes at 80° C. to form the ultraviolet ray-absorbing layer (H).

<Lamination of Protective Layer>

In the case of providing a protective layer, a prescribed binder solution or a prescribed mixed solution of a urethane resin and an acrylic resin was applied by means of an applicator so that a protective layer (F) with a film thickness after drying (hereinafter, dried film thickness) of 20 μm is obtained, after which the film was dried for 15 minutes at 80° C. to form the protective layer (F).

[Production Example of Formed Body Decorated with Laminated Film]

On a vertically ascending/descending table provided in a both-side vacuum forming apparatus (trade name NGF-0709, available from Fu-se Vacuum Forming Ltd.) composed of upper and lower boxes, an ABS-made base material (molded product) was mounted. Afterward, into a sheet clamping frame arranged above the molded base material (molded product) in the both-side vacuum forming apparatus, the laminated film obtained as above was fitted. Subsequently, the internal pressure was reduced so that the degree of vacuum in the upper and lower boxes becomes 1.0 kPa, the laminated film was heated by means of a near-infrared heater until the temperature of the laminated film becomes 90° C., and the molded base material was elevated to press-bond the molded base material and the laminated film, after which compressed air of 200 kPa was introduced into only the upper box and the state was kept for 35 seconds.

The internal pressure of the upper and lower boxes was released to the atmosphere to obtain a decorated formed body decorated with the laminated film.

Furthermore, the clear coating film layer (B) side of the decorated formed body was irradiated with ultraviolet rays of light quantity of 2000 mJ/cm$^2$ using a high-pressure mercury lamp of 120 W/cm, and the clear coating of the clear coating film layer (B) was cured to obtain a UV (ultraviolet ray) cured formed body.

In this connection, in the respective tables shown below, the following ingredients were used.

UV 1700B (The Nippon Synthetic Chemical Industry Co., Ltd.); a urethane acrylate oligomer Lucirin TPO (BASF Japan Ltd.); 2,4,6-trimethylbenzoyl-diphenyl-phosphine oxide NOVACLEAR SG007 (Mitsubishi Plastics, Inc.) A-PET Sheet SOFTSHINE (TOYOBO CO., LTD.) a biaxially oriented polyester film 1321 (TOAGOSEI CO., LTD.): a vinyl chloride-vinyl acetate copolymer resin TE-5430 (Mitsui Chemicals, Inc.): a urethane resin RT-87140 (Morton): an acrylic resin D-178N (Mitsui Chemicals, Inc.): allophanate-modified polyhexamethylene diisocyanate SOLBIN M5 (Nissin Chemical Industry Co., Ltd.): a vinyl chloride resin Metasheen 71-0010 (Ciba Specialty Chemicals): vapor-deposited aluminum UR-3200 (TOYOBO CO., LTD.): a polyester urethane resin The laminated film obtained was evaluated according to the following criteria.

Elongation: The laminated film including the base material was measured at a tensile speed of 50 mm/min under the temperature condition of 80° C. using the Autograph AG-IS available from SHIMADZU CORPORATION.

At the point of time when any one of layers is broken, the elongation was judged.

Formability: The both-side vacuum forming machine NGF-0709 available from Fu-se Vacuum Forming Ltd. was used to confirm the formability in the TOM forming.

⊙: Formable because even the highly-stretched portion of the laminated film follows the base material ◯: Formable because even the moderately stretched portion of the laminated film follows the base material Δ: Formable because the slightly stretched portion of the laminated film follows the base material
x: Unformable
Metallic appearance: The stretched portion after forming was visually evaluated.
⊙: Satisfactory in metallic appearance because even the highly-stretched portion of the laminated film follows the base material
○: Satisfactory in metallic appearance because even the moderately stretched portion of the laminated film follows the base material
Δ: Satisfactory in metallic appearance because the slightly stretched portion of the laminated film follows the base material
x: A split or white turbidity is observed
SW resistance after forming: Using a steel wool resistance testing machine, a pad of steel wool of #0000 was made to move back and forth ten times while being applied with a load of 100 g/cm².
⊙: No scratches are observed
○: Two or three linear scratches are observed
Δ: Countable linear scratches are observed
x: Countless linear scratches are observed
Impact resistance after forming: Using a Dupont impact resistance testing machine, a weight of 500 g was dropped from a height of 20 cm to confirm the split of the coating film.
○: No split is observed
Δ: The coating film has a slight flaw
x: The coating film has a significant flaw
Chemical resistance after forming: A cylindrical poly-ring with an inner diameter of 38 mm and a height of 15 mm was fixed on the surface of a coating film, the following solution was added dropwise, a lid was put on the opening, the liquid was allowed to settle under each condition, and the film after the test was washed with water to be compared with the initial state of the coating film.
Acid resistant test 0.1 N H₂SO₄ solution 5 ml 20° C.×24 h
Alkali resistant test 0.1 N NaOH solution 5 ml 55° C.×4 h
Water resistant test distilled water 5 ml 55° C.×4 h
⊙: There is no change in the coating film
○: There is a slight change in the appearance of the coating film (wrinkles, cracks)
Δ: There is an appreciable change in the appearance of the coating film (wrinkles, cracks)
x: There is a significant change in the appearance of the coating film (wrinkles, cracks)
The results are shown in the following Tables 1, 2, 4 to 7 and 9 to 12.

TABLE 1

| | | | Example No. | | | | | | | |
|---|---|---|---|---|---|---|---|---|---|---|
| | | | 1 | 2 | 3 | 4 | 5 | 6 | 7 | 8 |
| Base material film layer (D) | | Kind | NOVACLEAR SG007 | | | | | | | |
| | | Thickness | 220 μm | | | | | | | |
| Clear coating film layer (C) | Component C1 | Double bond equivalent | 600 | 600 | 600 | 600 | 600 | 600 | 600 | 600 |
| | | Urethane equivalent | 1500 | 1500 | 1500 | 1500 | 1500 | 1500 | 1500 | 1500 |
| | | Mw | 44000 | 44000 | 44000 | 44000 | 44000 | 44000 | 44000 | 44000 |
| | Component C2 | Monomer/Oligomer | UV1700B | | | | | | | |
| | Component C3 | Polymerization initiator | Lucirin TPO | | | | | | | |
| | Blending amount | C1 | 90 | 90 | 90 | 90 | 90 | 90 | 90 | 90 |
| | | C2 | 10 | 10 | 10 | 10 | 10 | 10 | 10 | 10 |
| | | C3 | 5 | 5 | 5 | 5 | 5 | 5 | 5 | 5 |
| | Drying temperature | | 80° C. | | | | | | | |
| | Drying time | | 15 minutes | | | | | | | |
| | Dried film thickness | | 20 μm | | | | | | | |
| Metallic tone design layer (B) | component B1 | Binder | SOLBIN M5 | | | | | | | |
| | component B2 | Vapor-deposited aluminum | Metasheen 71-0010 | | | | | | | |
| | Blending amount | B1 | 70 | 50 | 20 | 50 | 50 | 50 | 50 | 50 |
| | | B2 | 30 | 50 | 80 | 50 | 50 | 50 | 50 | 50 |
| | Drying temperature | | 80° C. | | | | | | | |
| | Drying time | | 15 minutes | | | | | | | |
| | Dried film thickness (μm) | | 0.15 | 0.15 | 0.15 | 0.07 | 0.15 | 0.25 | 1 | 0.25 |
| | Release layer (E) | | Presence | | | | | | | |
| Adhesion layer (A) | Kind | | UR-3200 | | | | | | | UR-3200 |
| | Drying temperature | | 80° C. | | | | | | | 85° C. |
| | Drying time | | 15 minutes | | | | | | | Laminate |
| | Dried film thickness | | 20 μm | | | | | | | |
| | Film constitution | | FIG. 1 | | | | | | | |
| | Base material | | ABS | | | | | | | |
| Characteristics | Before forming | Elongation | ○ | ○ | ○ | ○ | ○ | ○ | ○ | ○ |
| | | Formability | ○ | ○ | ○ | ○ | ○ | ○ | ○ | ○ |
| | After forming | Metallic appearance | ○ | ○ | ○ | ○Δ | ○ | ○ | ○ | ○ |
| | | SW resistance | ○ | ○ | ○ | ○ | ○ | ○ | ○ | ○ |
| | | Impact resistance | ○ | ○ | ○ | ○ | ○ | ○ | ○ | ○ |
| | | Chemical resistance | ○ | ○ | ○ | ○ | ○ | ○ | ○ | ○ |

TABLE 2

| | | | Example No. | | | | | | |
|---|---|---|---|---|---|---|---|---|---|
| | | | 9 | 10 | 11 | 12 | 13 | 14 | 15 |
| Base material film layer (D) | | Kind | NOVACLEAR SG007 | | | | | | |
| | | Thickness | 220 μm | | | | | | |
| Clear coating film layer (C) | Component C1 | Double bond equivalent | 600 | 600 | 600 | 600 | 600 | 600 | 600 |
| | | Urethane equivalent | 1500 | 1500 | 1500 | 1500 | 1500 | 1500 | 1500 |
| | | Mw | 44000 | 44000 | 44000 | 44000 | 44000 | 44000 | 44000 |
| | Component C2 | Monomer/ Oligomer | UV1700B | | | | | | |
| | Component C3 | Polymerization initiator | Lucirin TPO | | | | | | |
| | Blending amount | C1 | 90 | 90 | 90 | 90 | 90 | 90 | 90 |
| | | C2 | 10 | 10 | 10 | 10 | 10 | 10 | 10 |
| | | C3 | 5 | 5 | 5 | 5 | 5 | 5 | 5 |
| | | Drying temperature | 80° C. | | | | | | |
| | | Drying time | 15 minutes | | | | | | |
| | | Dried film thickness | 20 μm | | | | | | |
| Protective layer (F) | Component F | Binder | 1321 | TE-5430 | A | B | C | D | E |
| | | Drying temperature | 80° C. | | | | | | |
| | | Drying time | 15 minutes | | | | | | |
| | | Dried film thickness | 20 μm | | | | | | |
| Metallic tone design layer (B) | component B1 | Binder | SOLBIN M5 | | | | | | |
| | component B2 | Vapor-deposited aluminum | Metasheen 71-0010 | | | | | | |
| | Blending amount | B1 | 50 | 50 | 50 | 50 | 50 | 50 | 50 |
| | | B2 | 50 | 50 | 50 | 50 | 50 | 50 | 50 |
| | | Drying temperature | 80° C. | | | | | | |
| | | Drying time | 15 minutes | | | | | | |
| | | Dried film thickness | 0.15 μm | | | | | | |
| | Release layer (E) | | Presence | | | | | | |
| Adhesion layer (A) | | Kind | UR-3200 | | | | | | |
| | | Drying temperature | 80° C. | | | | | | |
| | | Drying time | 15 minutes | | | | | | |
| | | Dried film thickness | 20 μm | | | | | | |
| | Film constitution | | FIG. 2 | | | | | | |
| | Base material | | ABS | | | | | | |
| Characteristics | Before forming | Elongation | ○ | ○ | ○ | ○ | ○ | ○ | ○ |
| | | Formability | ○ | ○ | ○ | ○ | ○ | ○ | ○ |
| | After forming | Metallic appearance | ◎ | ◎ | ◎ | ◎ | ◎ | ◎ | ◎ |
| | | SW resistance | ○ | ○ | ○ | ○ | ○ | ○ | ○ |
| | | Impact resistance | ○ | ○ | ○ | ○ | ○ | ○ | ○ |
| | | Chemical resistance | ○ | ○ | ○ | ○ | ○ | ○ | ○ |

In this connection, as Formulations A to D in Table 2 mentioned above, formulations shown in the following Table 3 were adopted.

TABLE 3

| | Formulation | | | | |
|---|---|---|---|---|---|
| | A | B | C | D | E |
| TE-5430 | 80 | 80 | 80 | 60 | 60 |
| RT-87140 | 20 | 20 | 20 | 40 | 40 |
| D-178N | 0 | 1 | 1.5 | 0 | 1 |

TABLE 4

| | | Example No. | | | |
|---|---|---|---|---|---|
| | | 16 | 17 | 18 | 19 |
| Base material film layer (D) | Kind | SOFTSHINE | SG007 | SOFTSHINE | SOFTSHINE |
| | Thickness | 100 μm | 220 μm | 100 μm | 100 μm |

TABLE 4-continued

|  |  |  | Example No. | | | |
| --- | --- | --- | --- | --- | --- | --- |
|  |  |  | 16 | 17 | 18 | 19 |
| Clear coating film layer (C) | Component C1 | Double bond equivalent | 600 | 600 | 600 | 600 |
|  |  | Urethane equivalent | 1500 | 1500 | 1500 | 1500 |
|  |  | Mw | 44000 | 44000 | 44000 | 44000 |
|  | Component C2 | Monomer/Oligomer | UV1700B | | | |
|  | Component C3 | Polymerization initiator | Lucirin TPO | | | |
|  | Blending amount | C1 | 90 | 90 | 90 | 90 |
|  |  | C2 | 10 | 10 | 10 | 10 |
|  |  | C3 | 5 | 5 | 5 | 5 |
|  | Drying temperature | | 80° C. | | | |
|  | Drying time | | 15 minutes | | | |
|  | Dried film thickness | | 20 μm | | | |
| Protective layer (F) | Component F | Binder | — | — | — | TE-5430 |
|  | Drying temperature | | — | — | — | 80° C. |
|  | Drying time | | — | — | — | 15 minutes |
|  | Dried film thickness | | — | — | — | 20 μm |
| Metallic tone design layer (B) | component B1 | Binder | SOLBIN M5 | | | |
|  | component B2 | Vapor-deposited aluminum | Metasheen 71-0010 | | | |
|  | Blending amount | B1 | 50 | 50 | 50 | 50 |
|  |  | B2 | 50 | 50 | 50 | 50 |
|  | Drying temperature | | 80° C. | | | |
|  | Drying time | | 15 minutes | | | |
|  | Dried film thickness | | 0.15 μm | | | |
|  | Release layer (E) | | Absence | Presence | Absence | Absence |
| Adhesion layer (A) | Kind | | UR-3200 | | | |
|  | Drying temperature | | 80° C. | | | |
|  | Drying time | | 15 minutes | | | |
|  | Dried film thickness | | 20 μm | | | |
|  | Film constitution | | FIG. 1 | FIG. 2 | FIG. 3 | FIG. 4 |
|  | Base material | | ABS | | | |
| Characteristics | Before forming | Elongation | ○ | ○ | ○ | ○ |
|  |  | Formability | ○ | ○ | ○ | ○ |
|  | After forming | Metallic appearance | ○ | ○ | ○ | ◎ |
|  |  | SW resistance | ○ | ○ | ○ | ○ |
|  |  | Impact resistance | ○ | ○ | ○ | ○ |
|  |  | Chemical resistance | ○ | ○ | ○ | ○ |

TABLE 5

|  |  |  | Comparative example No. | | | |
| --- | --- | --- | --- | --- | --- | --- |
|  |  |  | 1 | 2 | 3 | 4 |
| Base material film layer (D) | Kind | | NOVACLEAR SG007 | | | |
|  | Thickness | | 220 μm | | | |
| Clear coating film layer (C) | Component C1 | Double bond equivalent | 600 | 600 | R-298-1 Clear | R-298-1 Clear |
|  |  | Urethane equivalent | 1500 | 1500 | | R-298 Curing agent |
|  |  | Mw | 44000 | 44000 | | |
|  | Component C2 | Monomer/Oligomer | UV1700B | | | |
|  | Component C3 | Polymerization initiator | Lucirin TPO | | | |
|  | Blending amount | C1 | 90 | 90 | | |
|  |  | C2 | 10 | 10 | | |
|  |  | C3 | 5 | 5 | | |

TABLE 5-continued

|  |  |  | Comparative example No. | | | |
| --- | --- | --- | --- | --- | --- | --- |
|  |  |  | 1 | 2 | 3 | 4 |
|  | Drying temperature | | 80° C. | | | |
|  | Drying time | | 15 minutes | | | |
|  | Dried film thickness | | 20 μm | | | |
| Metallic tone design layer (B) | component B1 | Binder | SOLBIN M5 | | | |
|  | component B2 | Vapor-deposited aluminum | 65-388 | 6320NS | Metasheen 71-0010 | |
|  | Blending amount | B1 | 85 | 85 | 50 | 50 |
|  |  | B2 | 15 | 15 | 50 | 50 |
|  | Drying temperature | | 80° C. | | | |
|  | Drying time | | 15 minutes | | | |
|  | Dried film thickness | | 15 μm | 15 μm | 0.15 μm | 0.15 μm |
|  | Release layer (E) | | Presence | | | |
| Adhesion layer (A) | Kind | | UR-3200 | | | |
|  | Drying temperature | | 80° C. | | | |
|  | Drying time | | 15 minutes | | | |
|  | Dried film thickness | | 20 μm | | | |
|  | Film constitution | | FIG. 1 | | | |
|  | Base material | | ABS | | | |
| Characteristics | Before forming | Elongation | ○ | ○ | ○ | X |
|  |  | Formability | ○ | ○ | ○ | X |
|  | After forming | Metallic appearance | X | X | Δ | ○ |
|  |  | SW resistance | ○ | ○ | X | ○ |
|  |  | Impact resistance | ○ | ○ | ○ | ○ |
|  |  | Chemical resistance | ○ | ○ | X | ○ |

TABLE 6

|  |  |  | Example No. | | | | | |
| --- | --- | --- | --- | --- | --- | --- | --- | --- |
|  |  |  | 20 | 21 | 22 | 23 | 24 | 25 |
| Base material film layer (D) | Kind | | NOVACLEAR SG007 | | | | | |
|  | Thickness | | 220 μm | | | | | |
| Clear coating film layer (C) | Component C1 | Double bond equivalent | 600 | 600 | 600 | 600 | 600 | 600 |
|  |  | Urethane equivalent | 1500 | 1500 | 1500 | 1500 | 1500 | 1500 |
|  |  | Mw | 44000 | 44000 | 44000 | 44000 | 44000 | 44000 |
|  | Component C2 | Monomer/Oligomer | UV1700B | | | | | |
|  | Component C3 | Polymerization initiator | Lucirin TPO | | | | | |
|  | Blending amount | C1 | 90 | 90 | 90 | 90 | 90 | 90 |
|  |  | C2 | 10 | 10 | 10 | 10 | 10 | 10 |
|  |  | C3 | 5 | 5 | 5 | 5 | 5 | 5 |
|  | Drying temperature | | 80° C. | | | | | |
|  | Drying time | | 15 minutes | | | | | |
|  | Dried film thickness | | 20 μm | | | | | |
| Metallic tone design layer (B) | Vapor-deposited layer | Vapor-deposited metal | Indium | | | | | Tin |
|  |  | Vapor-deposited thickness | 0.15 μm | 0.30 μm | 0.60 μm | 1.00 μm | 0.60 μm | 0.60 μm |
|  | Release layer (E) | | Presence | | | | | |
| Adhesion layer (A) | Kind | | UR-3200 | | | | UR-3200 | UR-3200 |
|  | Drying temperature | | 80° C. | | | | 85° C. | 80° C. |
|  | Drying time | | 15 minutes | | | | Laminate | 15 min. |
|  | Dried film thickness | | 20 μm | | | | | |
|  | Film constitution | | FIG. 1 | | | | | |
|  | Base material | | ABS | | | | | |

TABLE 6-continued

| | | | Example No. | | | | | |
|---|---|---|---|---|---|---|---|---|
| | | | 20 | 21 | 22 | 23 | 24 | 25 |
| Characteristics | Before forming | Elongation | ○ | ○ | ○ | ○ | ○ | ○ |
| | | Formability | ○ | ○ | ○ | ○ | ○ | ○ |
| | After forming | Metallic appearance | ○△ | ○ | ○ | ○△ | ○ | ○ |
| | | SW resistance | ○ | ○ | ○ | ○ | ○ | ○ |
| | | Impact resistance | ○ | ○ | ○ | ○ | ○ | ○ |
| | | Chemical resistance | ○ | ○ | ○ | ○ | ○ | ○ |

TABLE 7

| | | | Example No. | | | | | | |
|---|---|---|---|---|---|---|---|---|---|
| | | | 26 | 27 | 28 | 29 | 30 | 31 | 32 |
| Base material film layer (D) | Kind | | NOVACLEAR SG007 | | | | | | |
| | Thickness | | 220 μm | | | | | | |
| Clear coating film layer (C) | Component C1 | Double bond equivalent | 600 | 600 | 600 | 600 | 600 | 600 | 600 |
| | | Urethane equivalent | 1500 | 1500 | 1500 | 1500 | 1500 | 1500 | 1500 |
| | | Mw | 44000 | 44000 | 44000 | 44000 | 44000 | 44000 | 44000 |
| | Component C2 | Monomer/Oligomer | UV1700B | | | | | | |
| | Component C3 | Polymerization initiator | Lucirin TPO | | | | | | |
| | Blending amount | C1 | 90 | 90 | 90 | 90 | 90 | 90 | 90 |
| | | C2 | 10 | 10 | 10 | 10 | 10 | 10 | 10 |
| | | C3 | 5 | 5 | 5 | 5 | 5 | 5 | 5 |
| | Drying temperature | | 80° C. | | | | | | |
| | Drying time | | 15 minutes | | | | | | |
| | Dried film thickness | | 20 μm | | | | | | |
| Protective layer (F) | Component F | Binder | 1321 | TE-5430 | Formulation A | Formulation B | Formulation C | Formulation D | Formulation E |
| | Drying temperature | | 80° C. | | | | | | |
| | Drying time | | 15 分 | | | | | | |
| | Dried film thickness | | 20 μm | | | | | | |
| Metallic tone design layer (B) | Vapor-deposited layer | Vapor-deposited metal | Indium | | | | | | |
| | | Vapor-deposited thickness | 0.6 μm | | | | | | |
| | Release layer (E) | | Presence | | | | | | |
| Adhesion layer (A) | Kind | | UR-3200 | | | | | | |
| | Drying temperature | | 80° C. | | | | | | |
| | Drying time | | 15 minutes | | | | | | |
| | Dried film thickness | | 20 μm | | | | | | |
| | Film constitution | | FIG. 2 | | | | | | |
| | Base material | | ABS | | | | | | |
| Characteristics | Before forming | Elongation | ○ | ○ | ○ | ○ | ○ | ○ | ○ |
| | | Formability | ○ | ○ | ○ | ○ | ○ | ○ | ○ |
| | After forming | Metallic appearance | ◎ | ◎ | ◎ | ◎ | ◎ | ◎ | ◎ |
| | | SW resistance | ○ | ○ | ○ | ○ | ○ | ○ | ○ |
| | | Impact resistance | ○ | ○ | ○ | ○ | ○ | ○ | ○ |
| | | Chemical resistance | ○ | ○ | ○ | ○ | ○ | ○ | ○ |

TABLE 8

| | Formulation | | | | |
|---|---|---|---|---|---|
| | A | B | C | D | E |
| TE-5430 | 80 | 80 | 80 | 60 | 60 |
| RT-87140 | 20 | 20 | 20 | 40 | 40 |
| D-178N | 0 | 1 | 1.5 | 0 | 1 |

TABLE 9

| | | | Example No. | | | |
|---|---|---|---|---|---|---|
| | | | 33 | 34 | 35 | 36 |
| Base material film layer (D) | | Kind | SOFTSHINE | SG007 | SOFTSHINE | SOFTSHINE |
| | | Thickness | 100 μm | 220 μm | 100 μm | 100 μm |
| Clear coating film layer (C) | Component C1 | Double bond equivalent | 600 | 600 | 600 | 600 |
| | | Urethane | 1500 | 1500 | 1500 | 1500 |
| | | Mw | 44000 | 44000 | 44000 | 44000 |
| | Component C2 | Monomer/ Oligomer | | UV1700B | | |
| | Component C3 | Polymerization initiator | | Lucirin TPO | | |
| | Blending amount | C1 | 90 | 90 | 90 | 90 |
| | | C2 | 10 | 10 | 10 | 10 |
| | | C3 | 5 | 5 | 5 | 5 |
| | Drying temperature | | | 80° C. | | |
| | Drying time | | | 15 minutes | | |
| | Dried film thickness | | | 20 μm | | |
| Protective layer (F) | Component F | Binder | — | — | — | TE-5430 |
| | Drying temperature | | — | — | — | 80° C. |
| | Drying time | | — | — | — | 15 minutes |
| | Dried film thickness | | — | — | — | 20 μm |
| Metallic tone design layer (B) | Vapor-deposited layer | Vapor-deposited metal | | Indium | | |
| | | Vapor-deposited thickness | | 0.60 μm | | |
| | Release layer (E) | | Absence | Presence | Absence | Absence |
| Adhesion layer (A) | Kind | | | UR-3200 | | |
| | Drying temperature | | | 80° C. | | |
| | Drying time | | | 15 minutes | | |
| | Dried film thickness | | | 20 μm | | |
| | Film constitution | | FIG. 1 | FIG. 2 | FIG. 3 | FIG. 4 |
| | Base material | | | ABS | | |
| Characteristics | Before forming | Elongation | ○ | ○ | ○ | ○ |
| | | Formability | ○ | ○ | ○ | ○ |
| | After forming | Metallic | ○ | ○ | ○ | ◉ |
| | | SW resistance | ○ | ○ | ○ | ○ |
| | | Impact resistance | ○ | ○ | ○ | ○ |
| | | Chemical resistance | ○ | ○ | ○ | ○ |

TABLE 10

| | | | Comparative example No. | | |
|---|---|---|---|---|---|
| | | | 5 | 6 | 7 |
| Base material film layer (D) | | Kind | NOVACLEAR SG007 | | |
| | | Thickness | 220 μm | | |
| Clear coating film layer (C) | Component C1 | Double bond equivalent | 600 | R-298-1 Clear | R-298-1 Clear |
| | | Urethane | 1500 | | R-298 Curing agent |
| | | Mw | 44000 | | |
| | Component C2 | Monomer/ Oligomer | UV1700B | | |
| | Component C3 | Polymerization initiator | Lucirin TPO | | |
| | Blending amount | C1 | 90 | | |
| | | C2 | 10 | | |
| | | C3 | 5 | | |

TABLE 10-continued

|  |  |  | Comparative example No. | | |
|---|---|---|---|---|---|
|  |  |  | 5 | 6 | 7 |
|  |  | Drying temperature | | 80° C. | |
|  |  | Drying time | | 15 minutes | |
|  |  | Dried film thickness | | 20 μm | |
| Metallic tone design layer (B) | Vapor-deposited layer | Vapor-deposited metal | Aluminum | Indium | |
|  |  | Vapor-deposited thickness | 0.60 μm | 0.60 μm | 0.60 μm |
|  | Release layer (E) |  | Presence | Presence | Presence |
| Adhesion layer (A) |  | Kind | | UR-3200 | |
|  |  | Drying temperature | | 80° C. | |
|  |  | Drying time | | 15 minutes | |
|  |  | Dried film thickness | | 20 μm | |
|  |  | Film constitution | | FIG. 1 | |
|  |  | Base material | | ABS | |
| Characteristics | Before forming | Elongation | X | ◯ | X |
|  |  | Formability | X | ◯ | X |
|  | After forming | Metallic | X | Δ | ◯ |
|  |  | SW resistance | ◯ | X | ◯ |
|  |  | Impact resistance | ◯ | ◯ | ◯ |
|  |  | Chemical resistance | ◯ | X | ◯ |

TABLE 11

|  |  |  | Example No. 37 |
|---|---|---|---|
| Base material film layer (D) |  | Kind | NOVACLEAR SG007 |
|  |  | Thickness | 220 μm |
| Clear coating film layer (C) | Component C1 | Double bond equivalent | 600 |
|  |  | Urethane equivalent | 1500 |
|  |  | Mw | 44000 |
|  | Component C2 | Monomer/Oligomer | UV1700B |
|  | Component C3 | Polymerization initiator | Lucirin TPO |
|  | Blending amount | C1 | 90 |
|  |  | C2 | 10 |
|  |  | C3 | 5 |
|  |  | Drying temperature | 80° C. |
|  |  | Drying time | 15 minutes |
|  |  | Dried film thickness | 20 μm |
| Ultraviolet ray-absorbing layer (H) | Component H1 | Binder | TE-5430 |
|  | Component H2 | UV absorber | Tinuvin 900 |
|  | Blending amount | H1 | 94 |
|  |  | H2 | 6 |
|  |  | Drying temperature | 80° C. |
|  |  | Drying time | 15 minutes |
|  |  | Dried film thickness | 20 μm |
| Protective layer (F) | Component F | Binder | TE-5430 |
|  |  | Drying temperature | 80° C. |
|  |  | Drying time | 15 minutes |
|  |  | Dried film thickness | 20 μm |
| Metallic tone design layer (B) | component B1 | Binder | SOLBIN M5 |
|  | component B2 | Vapor-deposited aluminum | Metasheen 71-0010 |
|  | Blending amount | B1 | 50 |
|  |  | B2 | 50 |
|  |  | Drying temperature | 80° C. |
|  |  | Drying time | 15 minutes |
|  |  | Dried film thickness | 0.15 μm |
|  | Release layer (E) |  | Presence |
| Adhesion layer (A) |  | Kind | UR-3200 |
|  |  | Drying temperature | 80° C. |
|  |  | Drying time | 15 minutes |
|  |  | Dried film thickness | 20 μm |
|  |  | Film constitution | FIG. 1 |
|  |  | Base material | ABS |
| Characteristics | Before forming | Elongation | ◯ |
|  |  | Formability | ◯ |

TABLE 11-continued

|  |  | Example No. 37 |
|---|---|---|
| After forming | Printing appearance | ○ |
|  | Metallic appearance | ◎ |
|  | SW resistance | ○ |
|  | Impact resistance | ○ |
|  | Chemical resistance | ○ |

TABLE 12

|  |  |  | Example No. 38 |
|---|---|---|---|
| Base material film layer (D) |  | Kind | NOVACLEAR SG007 |
|  |  | Thickness | 220 μm |
| Clear coating film layer (C) | Component C1 | Double bond equivalent | 600 |
|  |  | Urethane equivalent | 1500 |
|  |  | Mw | 44000 |
|  | Component C2 | Monomer/Oligomer | UV1700B |
|  | Component C3 | Polymerization initiator | Lucirin TPO |
|  | Blending amount | C1 | 90 |
|  |  | C2 | 10 |
|  |  | C3 | 5 |
|  |  | Drying temperature | 80° C. |
|  |  | Drying time | 15 minutes |
|  |  | Dried film thickness | 20 μm |
| Ultraviolet ray-absorbing layer (H) | Component H1 | Binder | TE-5430 |
|  | Component H2 | UV absorber | Tinuvin 900 |
|  | Blending amount | H1 | 94 |
|  |  | H2 | 6 |
|  |  | Drying temperature | 80° C. |
|  |  | Drying time | 15 minutes |
|  |  | Dried film thickness | 20 μm |
| Protective layer (F) | Component F | Binder | TE-5430 |
|  |  | Drying temperature | 80° C. |
|  |  | Drying time | 15 minutes |
|  |  | Dried film thickness | 20 μm |
| Metallic tone design layer (B) | Vapor-deposited layer | Vapor-deposited metal | Indium |
|  |  | Vapor-deposited thickness | 0.60 μm |
|  | Release layer (E) |  | Presence |
| Adhesion layer (A) |  | Kind | UR-3200 |
|  |  | Drying temperature | 80° C. |
|  |  | Drying time | 15 minutes |
|  |  | Dried film thickness | 20 μm |
|  |  | Film constitution | FIG. 1 |
|  |  | Base material | ABS |
| Characteristics | Before forming | Elongation | ○ |
|  |  | Formability | ○ |
|  | After forming | Printing appearance | ○ |
|  |  | Metallic appearance | ◎ |
|  |  | SW resistance | ○ |
|  |  | Impact resistance | ○ |
|  |  | Chemical resistance | ○ |

From the results of the foregoing examples, it is obvious that the laminated film for decorating a three-dimensional molded product according to the present disclosure is satisfactory in formability and the formed product obtained has a satisfactory metallic tone design property.

INDUSTRIAL APPLICABILITY

The laminated film for decorating a three-dimensional molded product according to the present disclosure can be suitably used at the time of subjecting various molded bodies having a three-dimensional shape to metallic tone decorating.

REFERENCE SIGN LIST (A): Adhesion layer
(B): Metallic tone design layer
(C): Clear coating film layer
(D): Base material film layer
(E): Release layer
(F): Protective layer
(G): Design layer formed by inkjet printing
(H): Ultraviolet ray-absorbing layer

The invention claimed is:

1. A laminated film for decorating a three-dimensional molded product, comprising:
   an adhesion layer (A),
   a metallic tone design layer (B) constituted of a coating film layer (B-1) containing vapor-deposited aluminum, or a vapor-deposited metal layer (B-2) composed of indium or tin,
   a clear coating film layer (C) comprising an energy ray-curable coating film, and
   a base material film layer (D), wherein the clear coating film layer (C) is formed from an active energy ray-curing type coating composition containing a polyurethane acrylate (C1), a monomer/oligomer (C2) having an unsaturated double bond, and a polymerization initiator (C3), and wherein the polyurethane acrylate (C1) has a double bond equivalent of 130 to 600 g/eq, a molecular weight of 3000 to 200000, and a urethane concentration of 300 to 2000 g/eq.

2. The laminated film according to claim 1, wherein the metallic tone design layer (B) has a thickness of less than, or equal to, 5 μm.

3. The laminated film according to claim 1, further comprising a design layer (G) formed by printing.

4. The laminated film according to claim 1, further comprising a protective layer (F) adjacent to the metallic tone design layer (B).

5. A method of decorating a three-dimensional molded product, comprising a step of bonding the adhesion layer of the laminated film according to claim 3 to a surface of the three-dimensional molded product under a heating condition.

6. A method of decorating a three-dimensional molded product, comprising a step of bonding the adhesion layer of the laminated film according to claim 4 to a surface of the three-dimensional molded product under a heating condition.

7. The laminated film according to claim 3, further comprising:

a protective layer (F) adjacent to the metallic tone design layer (B).

* * * * *